US012627272B2

(12) United States Patent
Mohammed et al.

(10) Patent No.: US 12,627,272 B2

(45) Date of Patent: May 12, 2026

(54) ENHANCED GAIN OF OPERATIONAL AMPLIFIERS THROUGH LOW-FREQUENCY ZERO POSITIONING

(71) Applicant: THE ROYAL INSTITUTION FOR THE ADVANCEMENT OF LEARNING/MCGILL UNIVERSITY, Montréal (CA)

(72) Inventors: Mahmood A. Mohammed, Montreal (CA); Gordon Roberts, Montreal West (CA)

(73) Assignee: THE ROYAL INSTITUTION FOR THE ADVANCEMENT OF LEARNING/MCGILL UNIVERSITY, Montreal (CA)

( * ) Notice: Subject to any disclaimer, the term of this patent is extended or adjusted under 35 U.S.C. 154(b) by 559 days.

(21) Appl. No.: 17/749,434

(22) Filed: May 20, 2022

(65) Prior Publication Data

US 2022/0399863 A1 Dec. 15, 2022

Related U.S. Application Data

(60) Provisional application No. 63/190,961, filed on May 20, 2021.

(51) Int. Cl.
*H03F 3/45* (2006.01)

(52) U.S. Cl.
CPC ................................ *H03F 3/45475* (2013.01)

(58) Field of Classification Search
CPC .. H03F 3/45475; H03F 3/45183; H03F 1/083; H03F 2200/297; H03F 2200/405;
(Continued)

(56) References Cited

U.S. PATENT DOCUMENTS 3,688,250 A * 8/1972 Howlett ............... H03G 3/3026 367/67

7,692,489 B2 * 4/2010 Kelly .................. H03F 3/45968 330/261

(Continued)

OTHER PUBLICATIONS

Yang et al., "Synthesis of High Gain Operational Transconductance Amplifiers for Closed-Loop Operation Using a Generalized Controller-Based Compensation Method", IEEE Transactions on Circuits and Systems I: Regular Papers (vol. 63, Issue: 11, 2016), DOI: 10.1109/TCSI.2016.2599180;.

(Continued)

*Primary Examiner* — Andrea Lindgren Baltzell
*Assistant Examiner* — Nareh Shamiryan
(74) *Attorney, Agent, or Firm* — NORTON ROSE FULBRIGHT CANADA LLP

(57) ABSTRACT

An amplifier circuit comprises a multi-stage amplifier having a plurality of amplifiers cascaded between an input port $V_{in}$ and an output port $V_{out}$ to form a differential input stage and N subsequent gain stages, a capacitive load $C_L$ coupled to the output port $V_{out}$, and a compensation network coupled to the multi-stage amplifier and configured for positioning Pole-Zero pairs of each stage of the multi-stage amplifier below a unity gain frequency $\omega_t$ of the multi-stage amplifier when compensated, with Zeros positioned lower than Poles so as to increase the unity gain frequency $\omega_t$.

18 Claims, 19 Drawing Sheets

(58) Field of Classification Search
CPC . H03F 2203/45138; H03F 2203/45526; H03F 2203/45631; H03F 2203/45652
See application file for complete search history.

(56) References Cited

U.S. PATENT DOCUMENTS

| | | | | |
|---|---|---|---|---|
| 2005/0174171 | A1* | 8/2005 | Oswal | H03F 3/45659 330/69 |
| 2017/0373650 | A1* | 12/2017 | Roberts | H03F 3/04 |
| 2018/0309416 | A1* | 10/2018 | Wen | H03F 1/14 |
| 2019/0004553 | A1* | 1/2019 | Ming | H03F 3/3061 |

OTHER PUBLICATIONS

Fordjour et al., "A 175.2-mW 4-Stage OTA With Wide Load Range (400 pF-12 nF) Using Active Parallel Compensation", IEEE Transactions on Very Large Scale Integration (VLSI) Systems (vol. 28, Issue: 7, 2020), DOI: 10.1109/TVLSI.2020.2993059;.
Grasso et al., "High-Performance Four-Stage Cmos Ota Suitable for Large Capacitive Loads", IEEE Transactions on Circuits and Systems I: Regular Papers (vol. 62, Issue: 10, 2015), DOI: 10.1109/TCSI.2015.2476298;.
Mojarad et al., "A low-power four-stage amplifier for driving large capacitive loads", International Journal of Circuit Theory and Applications, 42(9), 2014, DOI: 10.1002/cta. 1899;.
Grasso et al., "High-performance frequency compensation topology for four-stage OTAs", 21st IEEE International Conference on Electronics, Circuits and Systems (ICECS), 2014, DOI: 10.1109/ICECS.2014.7049959;.
Yan et al., "Efficient four-stage frequency compensation for low-voltage amplifiers", IEEE International Symposium on Circuits and Systems (ISCAS), 2008, DOI: 10.1109/ISCAS.2008.4541908;.
Riad et al., "Power-Scaling Output-Compensated Three-Stage OTAs for Wide Load Range Applications", IEEE Transactions on Circuits and Systems I: Regular Papers (vol. 67, Issue: 7, 2020), DOI: 10.1109/TCSI.2020.2978515;.
Kulej et al., "A 0.3-V 98-dB Rail-to-Rail OTA in 0.18 u m Cmos", IEEE Access (vol. 8), 2020, DOI: 10.1109/ ACCESS.2020.2972067;.
Anisheh et al., "A 84 dB DC-Gain Two-Stage Class-AB OTA", IET Circuits, Devices & Systems, 13(5), 2019, DOI: 10.1049/iet-cds.2018.5038;.
Mohammed et al., "Investigating the Developments on the Frequency Compensation Techniques of the Two-Stage OTAs—A Brief Guide and Updated Review—", 31st International Conference on Microelectronics (ICM), 2019, DOI: 10.1109/ICM48031.2019.9021776;.
Mohammed et al., "The Impact of the Scaled-Down CMOS Technologies on the Step Response Degradation Caused by the Pole-Zero Doublets in the OTAs", IEEE 11th Latin American Symposium on Circuits & Systems (LASCAS), 2020, DOI: 10.1109/ LASCAS45839.2020.9069003.

* cited by examiner

ENHANCED GAIN OF OPERATIONAL AMPLIFIERS THROUGH LOW-FREQUENCY ZERO POSITIONING

CROSS REFERENCE TO RELATED APPLICATIONS

This patent application claims priority of U.S. provisional Application Ser. No. 63/190,961, filed on May 20, 2021, the entire contents of which are hereby incorporated by reference.

TECHNICAL FIELD

The present disclosure generally relates to designs for amplifier circuits.

BACKGROUND OF THE ART

Modern analog applications require high gain and high speed operational transconductance amplifiers (OTAs). However, advanced nanometer-scale technology nodes face challenges in meeting such requirements. While recent design efforts have been focused on proposing different techniques and topologies to overcome the limitations of such scaled-down technologies, there is room for improvements.

SUMMARY

In accordance with one aspect, there is provided an amplifier circuit. The circuit comprises a multi-stage amplifier having a plurality of amplifiers cascaded between an input port $V_{in}$ and an output port $V_{out}$ to form a differential input stage and N subsequent gain stages, a capacitive load $C_L$ coupled to the output port $V_{out}$, and a compensation network coupled to the multi-stage amplifier and configured for positioning Pole-Zero pairs of each stage of the multi-stage amplifier below a unity gain frequency $\omega_t$ of the multi-stage amplifier when compensated, with Zeros positioned lower than Poles so as to increase the unity gain frequency $\omega_t$.

In some embodiments, the compensation network is further configured for positioning the Pole-Zero pairs of each stage of the multi-stage amplifier above a 3 dB frequency ωP0 of the multi-stage amplifier when compensated so as to increase a load-drive capability of the multi-stage amplifier.

In some embodiments, the capacitive load CL is in a range of pF to μF.

In some embodiments, the capacitive load $C_L$ is in a nF range.

In some embodiments, the multi-stage amplifier is a Miller RC differential-ended two-stage operational transconductance amplifier.

In some embodiments, N is an integer from 2 to 8.

In some embodiments, each of the N subsequent gain stages is a replicated common source gain stage.

In some embodiments, each of the N subsequent gain stages produces a same direct current (DC) gain as remaining ones of the N subsequent gain stages.

In some embodiments, each common source gain stage has a DC gain between about 20 dB and about 25 dB.

In some embodiments, the compensation network comprises a plurality of compensation circuits, with a compensation circuit being provided for each stage of the multi-stage amplifier, and further wherein values of the compensation circuit for a 2-stage amplifier are scaled to size the compensation circuit of higher stages.

In some embodiments, the compensation circuit for each stage of the multi-stage amplifier is a multi-Miller RC compensation circuit, the plurality of compensation circuits configured to create paths between inputs and outputs of all stages of the multi-stage amplifier.

In some embodiments, the multi-stage amplifier comprises a plurality of compensation resistors and a plurality of compensation capacitors, further wherein, when a new stage is added to the multi-stage amplifier, a size of the compensation resistors of preceding stages of the multi-stage amplifier is reduced to increase a frequency of Zeros of the new stage and a size of the compensation capacitors of the preceding stages is increased to decrease a frequency of Poles of the new stage.

In some embodiments, each stage higher than the second stage comprises a compensation capacitor sized to a minimum capacitance value identified for the 2-stage amplifier.

In some embodiments, the multi-stage amplifier comprises at least one common-mode feedback circuit configured to apply biasing voltages to outputs of the stages of the multi-stage amplifier.

In some embodiments, for N s 3, the at least one common-mode feedback circuit comprises a first common-mode feedback circuit connected to an output of the second stage of the multi-stage amplifier.

In some embodiments, for N=2, the first common-mode feedback circuit is connected to an output of a second stage of the multi-stage amplifier.

In some embodiments, for N=3, the first common-mode feedback circuit is connected to an output of a third stage of the multi-stage amplifier.

In some embodiments, for N≥4, the at least one common-mode feedback circuit further comprises a second common-mode feedback circuit, the first common-mode feedback circuit connected to an output of a third stage of the multi-stage amplifier and the second common-mode feedback circuit connected to an output of each additional stage following the third stage.

Features described herein may be used in various combinations, in accordance with the embodiments described herein.

BRIEF DESCRIPTION OF THE FIGURES

Reference is now made to the accompanying figures in which:

FIG. 11A illustrates the proposed two-stage CMOS OTA of FIG. 2C, FIG. 11B illustrates the proposed three-stage CMOS OTA of FIG. 2C, and FIG. 11C illustrates the proposed four-stage CMOS OTA of FIG. 2C;

FIG. 13A illustrates the 2-stage OTA, FIG. 13B illustrates the 3-stage OTA, and FIG. 13C illustrates the 4-stage OTA.

It will be noted that throughout the appended drawings, like features are identified by like reference numerals.

DETAILED DESCRIPTION

The present disclosure is directed to design techniques for enhancing the DC gain of operational amplifiers while nullifying the effects of parasitics and coupling introduced when using pole-splitting as a frequency compensation technique. The design techniques involve positioning the poles and zeros below the unity gain frequency $\omega_t$ in the open-loop response of the operational transconductance amplifier (OTA) such that when closing the loop, they create a closed-loop pole-zero doublet that is clustered below the high frequency closed loop pole located at $\omega_t$. The lower the frequency of the zeros, regardless of the low frequency poles location (whether they are at DC and/or at low frequencies), the better the performance. The zeros are positioned lower than the poles in order to boost the unity gain frequency. With large gain amplifiers, the excess residual tail response time, due to the closed-loop Pole-Zero (P-Z) doublet, can be minimized to provide a single-time-constant response, using a trade-off between speed and loads. By cascading a plurality of OTA stages, the gain can be increased and the delay caused by the closed-loop P-Z doublets can be minimized. The capacitive load can range from pF to nF.

Figure 1A:
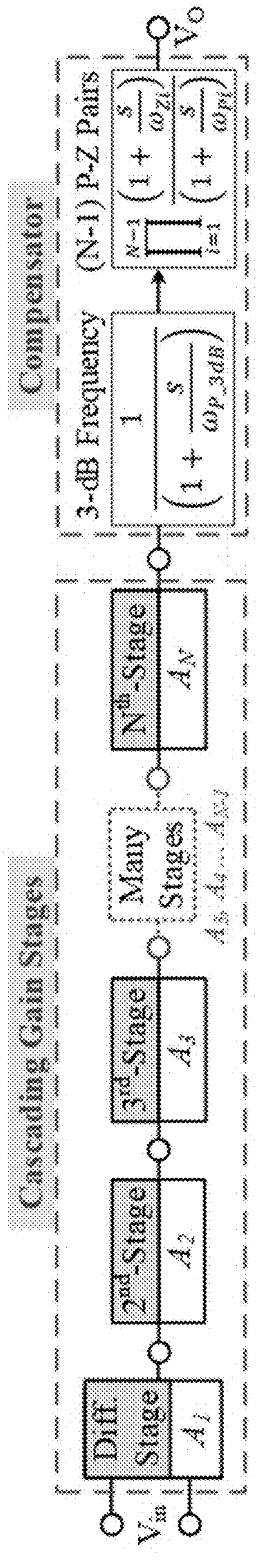
FIGS. 1A-1B show a proposed scalable many-stage OTA design.
Figure 1B:
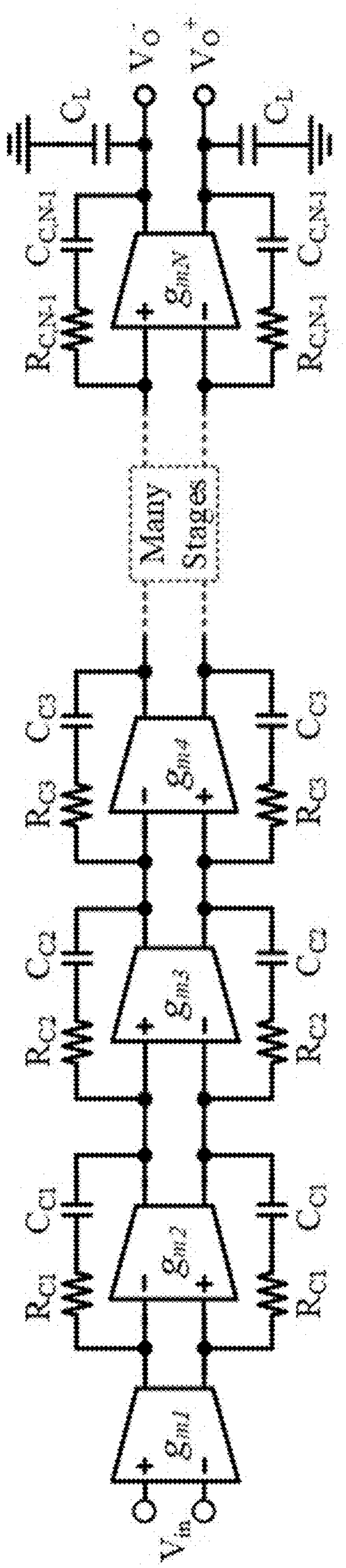
Figure 2A:
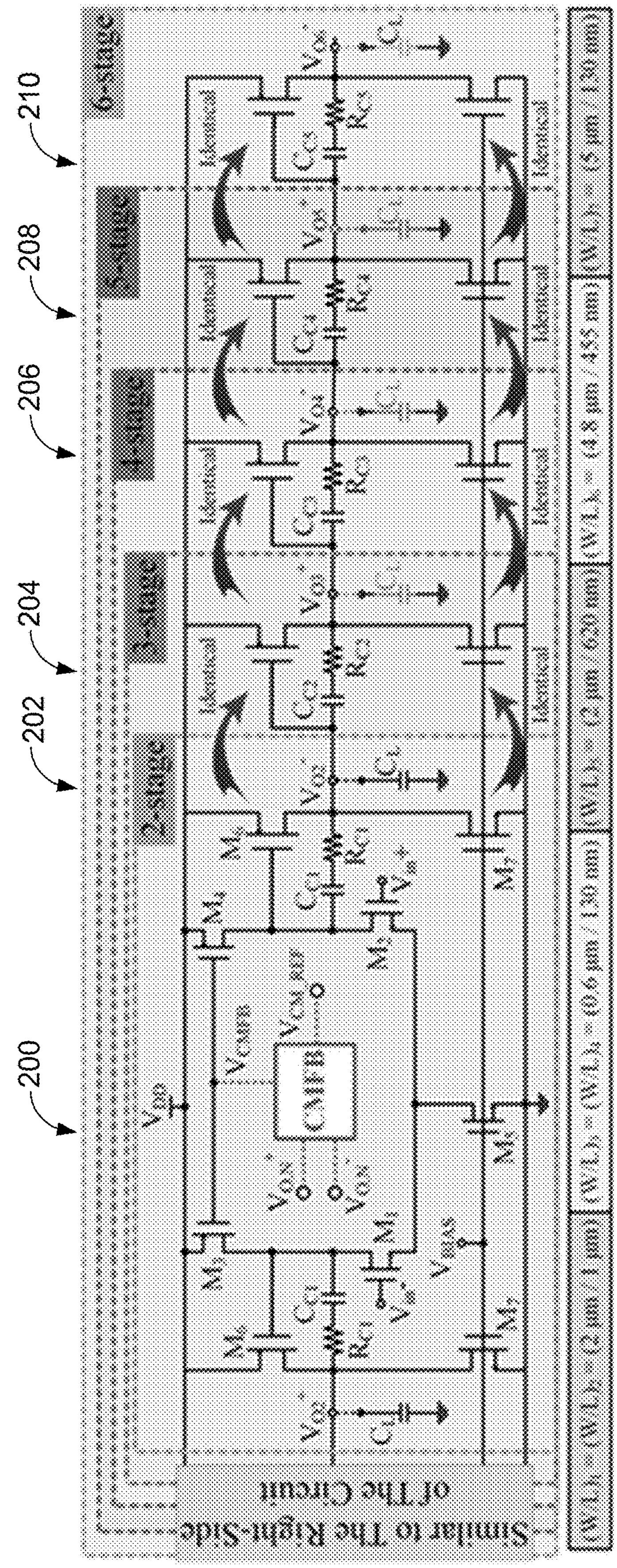
FIGS. 2A-2B are examples of transistor level implementation of a 6-stage OTA design and 8-stage OTA design, respectively.
Figure 2B:
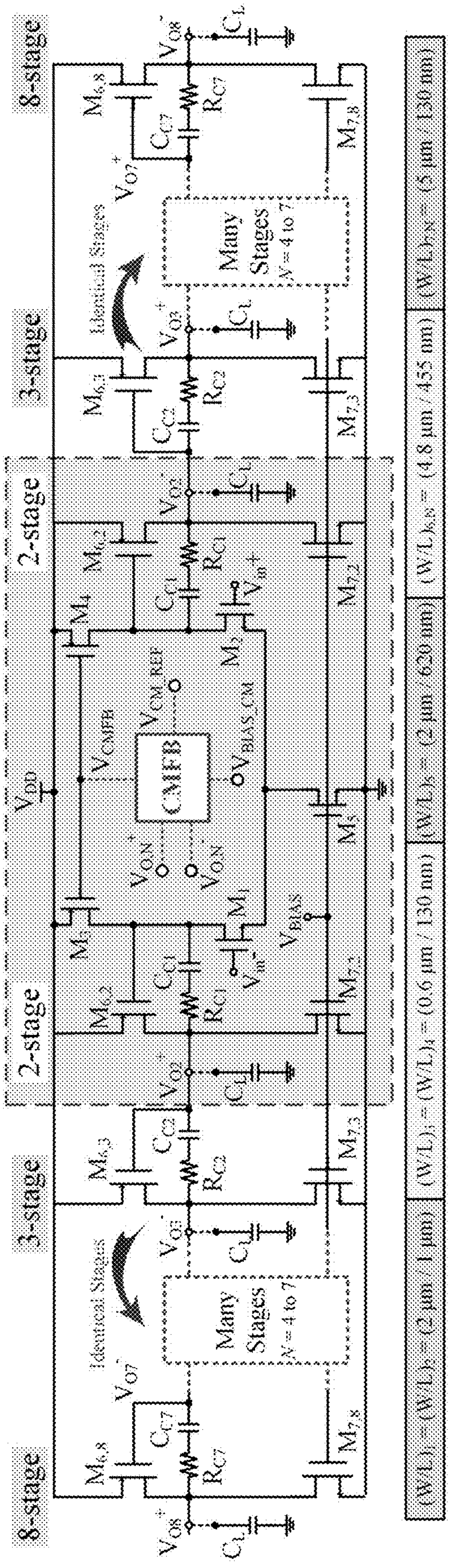
Figure 2C:
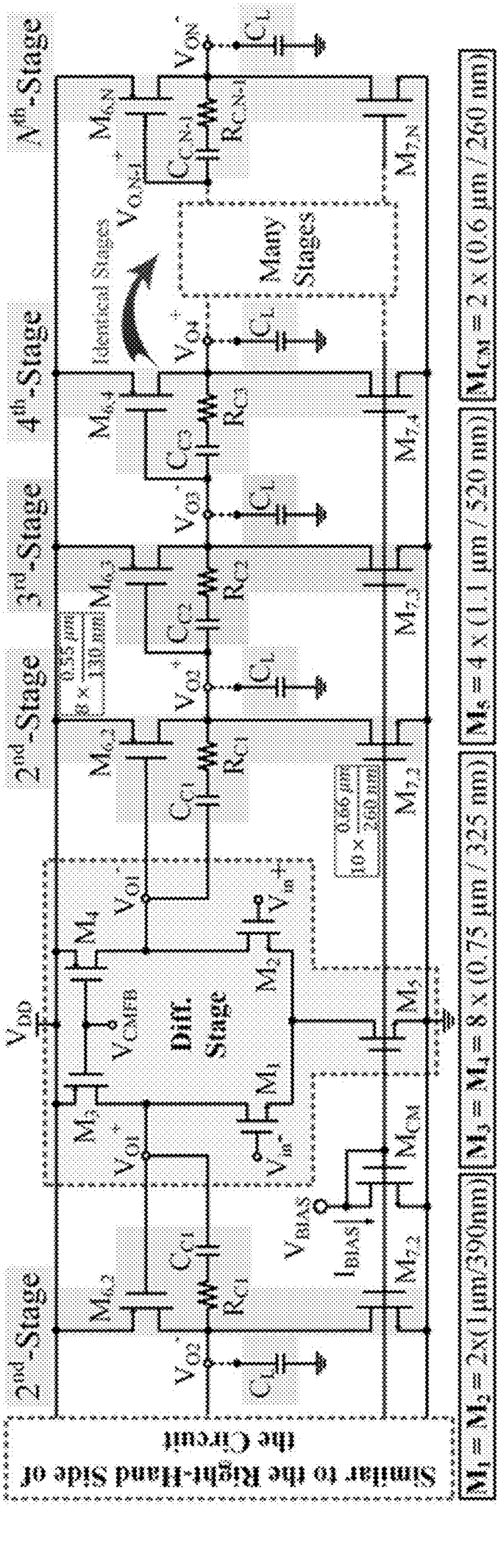
FIG. 2C is an example transistor level implementation of an N-stage OTA design.

In one embodiment, a scalable OTA design is described that maintains stability in closed-loop applications while enabling the cascade of many OTA gain-stages. The design uses a Frequency Compensation Technique (FCT) that enables stable scalability through systematic positioning of the poles and zeros of the many-stage OTA circuit. FIGS. 1A-1B show an example of the scalable many-stage OTA design. A differential input-stage is followed by many gain-stages, and a compensation network is coupled thereto. FIG. 2A shows the transistor level implementation of the differential stage, which serves as the $1^{st}$ stage 200 (i.e. $M_1$-$M_5$), followed by five identical Common Source (CS) gain stages. As illustrated in FIG. 2A, the second stage 202 consists of $M_6$ and $M_7$ while subsequent stages 204-210 consist of transistors identical to them. In this example, there are six gain stages and they are identical in transistor aspect ratios. However, different sizes may be used. FIG. 2B illustrates another example, with eight gain stages and showing both sides (differential) of the structure of the proposed OTA. Thus, the proposed FCT may be applicable to N-stage CMOS OTAs. FIG. 2C illustrates the general case, with N gain stages, N being an integer having any suitable value (e.g., ranging from 2 to 8). In addition, the proposed FCT is not constrained by any specific circuit topology and is technology independent.

Figure 2E:
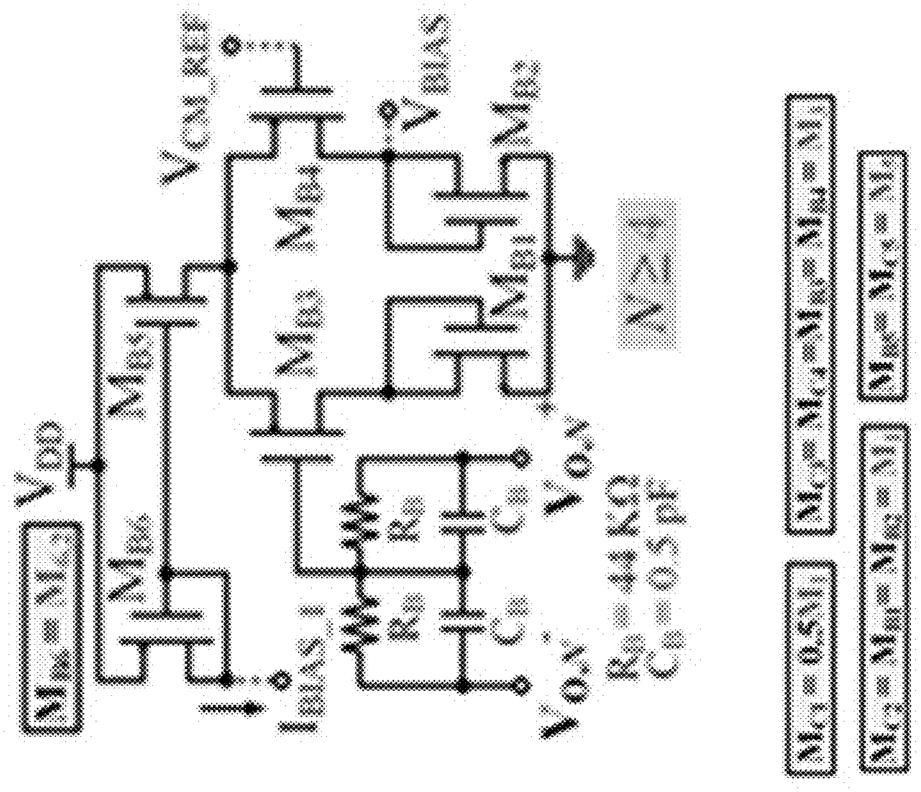
FIG. 2E illustrates a common mode feedback circuit used for N≥4.

As previously noted, the purpose of the proposed architecture is to provide a uniform scalable DC gain, where each gain-stage produces the same DC gain. Hence, it is proposed to bias all gain stages at the same voltage, and for all transistors' sizes of the CS gain stages to be identical. The gain stages are biased with the current mirror transistors being used $M_{CM}$, $M_5$ and $M_{7,i}$ for the $i^{th}$ gain stage, with i=2, . . . , N (see FIG. 2C). However, to ensure proper biasing of the output voltages, it is proposed to include the Common-Mode Feedback (CMFB) circuits of FIGS. 2D and 2E in the design. Any suitable technique may be used to implement the CMFB circuits. If a 2-stage OTA (i.e. N=2) is to be designed, it is proposed to use the CMFB circuit of FIG. 2D, and to create the CMFB voltage ($V_{CMFB}$) at the drain of $M_{C1}$. If N=3 (i.e., a 3-stage OTA is to be designed), it is proposed to create $V_{CMFB}$ at the drain of $M_{C2}$ (in FIG. 2D). Once more than three gain-stages are needed, the DC gain will significantly increase, thus, the CMFB circuit of FIG. 2D will not be able to hold the biasing voltages at the output of all gain-stages. Therefore, when N≥4, it is proposed to use an extra (i.e. second) CMFB circuit, as illustrated in FIG. 2E, to keep the biasing voltages of the additional gain-stages within the required values. In this case, the CMFB circuit of FIG. 2E is connected at the differential output of the third gain-stage, while the CMFB circuit of FIG. 2E is connected at the differential output of each new gain-stage (i.e., N≥4).

The circuit uses a differential-ended configuration. In FIGS. 2A and 2C, only the right-hand side is shown and an identical left-hand side has been omitted for simplicity. Both sides are partially shown in FIG. 2B. The overall DC gain, $A_O$, is the gain of the differential stage multiplied by the gain of each CS stage, and can be expressed as:

$$A_{O,N} = \prod_{i=1}^{N}(A_i) = (g_m R_O)_{Diff} \times \prod_{i=2}^{N}(g_{mi} R_{Oi}),\ 2 \le N \le 8 \tag{1}$$

where $A_i$ is the gain provided by the $i^{th}$ gain stage, with $A_i=g_mR_O$, $g_m$ is the transconductance of each stage, $R_O$ is the output resistance of each stage and N is the number of stages needed to achieve the required DC gain.

In some embodiments, N=8 and the architecture provides a scalable DC gain in the range of 50 dB to 200 dB with an increment of 25 dB per stage. In some embodiments, other increments are used per stage, such as, but not limited to, 20 dB or a value substantially close to 20 dB. Therefore, each stage is designed to achieve a DC gain of a given value (including the differential input-stage), which determines the required sizes of all transistors to meet power consumption and overdrive voltage requirements. The DC gain per stage also defines the values of the small-signal parameters (i.e. $g_m$ and $R_O$) of all transistors. FIG. 2F illustrates the ideal single-ended small-signal model of the circuit level realization of FIG. 1B. In order to obtain an overall DC gain of 50 dB, a designer would select N=2, or in other words, use the 2-stage OTA topology. Likewise, the 3-stage, 4-stage, 5-stage, 6-stage, 7-stage, and 8-stage OTA configurations would achieve gains of 75 dB 100 dB, 125 dB, 150 dB, 175 dB, and 200 dB, respectively. Transistor sizes for N=6 and N=8 are illustratively presented in FIGS. 2A and 2B, respectively.

The open-loop input-output transfer function of the circuits of FIGS. 2A, 2B can be approximated as:

$$A(s) = \frac{A_{O,N}}{\left(1+\frac{S}{\omega_{P0}}\right)} \times \prod_{i=1}^{N-1} \frac{\left(1+\frac{S}{\omega_{Zi}}\right)}{\left(1+\frac{S}{\omega_{Pi}}\right)} \tag{2}$$

where $A_{O,N}$ is the DC gain of the required number of stages, $\omega_{P0}$ is the 3-dB frequency, $\omega_{Pi}$ and $\omega_{Zi}$ are the frequencies of open-loop Pole-Zero Pairs (P-ZPs) which are produced by the compensation circuit of each stage, with $\omega_{Pi}$ being the frequency of the $i^{th}$ pole and $\omega_{Zi}$ being the frequency of the $i^{th}$ zero.

Usually, in conventional FCTs, these P-ZPs are either pushed to frequencies much higher than $\omega_t$ or positioned at the same exact frequency to get full P-Z cancellation. However, these conventional FCTs are associated with many disadvantages that prevent most proposed designs from scaling beyond 4-stages. Unlike conventional FCTs, the goal of the proposed scalable FCT is to position the open-loop P-ZPs at frequencies below $\omega_t$ and above $\omega_{P0}$, without P-Z exclusion or cancellation, such that:

$$\omega_{P0}<\omega_{z1}<\omega_{P1}<\omega_{z2}<\omega_{P2}< \dots <\omega_{zi}<\omega_{Pi}<\omega_t \tag{3}$$

By doing so, the unity-gain frequency is no longer equal to the Gain-Bandwidth Product (GBP), but it is now given by:

$$\omega_t = A_{O,N} \times \omega_{P0} \times \prod_{i=1}^{N-1}\left(\frac{\omega_{Pi}}{\omega_{Zi}}\right). \tag{4}$$

To position the P-ZPs according to Eqn. (3), one can size the R-C compensation circuit based on the exact equations for each pole and each zero. This can be done for the 2- and 3-stage OTAs. However, moving to the 4-stage and higher OTAs, using these equations may become complicated as the coupling between stages becomes more significant. Accordingly, the proposed FCT avoids such levels of complexity by designing the compensation circuit of the 2-stage OTA first (i.e. $R_{C1,(2\text{-}stage.)}$ and $C_{C1,(2\text{-}stage.)}$) and then scaling these values for higher stages.

According to equation (2), the OTA may have a different number of poles and zeros based on the value of N. For example, according to FIGS. 2A-2C, and based on network theory, if N=2, one can identify that the 2-stage OTA circuit has three poles and one zero. Typically, only two-poles of this circuit are of concern, as the third is assumed to be at a frequency much higher than $\omega_t$. As a result, the 2-poles and zero frequency locations can be approximated based on some assumptions as:

$$\omega_{P0} \approx \frac{g_{m,2}C_{C1}}{C_{O,1}C_L + C_{C1}(C_{O,1}+C_L)} \approx \frac{g_{m,2}}{C_L} \tag{5}$$

$$\omega_{P1} \approx \frac{1}{g_{m,2}R_{O,1}R_{O,2}C_{C1}} \tag{6}$$

$$\omega_{Z1} \approx -\left(\frac{g_{m,2}}{C_{C1}}\right)\frac{1}{(1-g_{m,2}R_{C,1})} \tag{7}$$

where $C_{O,1}$ represents the total shunt capacitance to ground on the output node of the first stage of the OTA (i.e. is the total parasitic capacitance seen at the input of the second stage), $C_L$ represents the capacitive load, $C_{C1}$ represents the compensation capacitor of the first stage, $R_{C,1}$ represents the compensation resistor of the first stage, $g_{m,2}$ represents the transconductance of the second stage, $R_{O,1}$ represents the output resistance of the first stage, $R_{O,2}$ represents the output resistance of the second stage.

When designing the 2-stage OTA 202, the upper limit of $\omega_t$, which is the third (parasitic) pole $\omega_{P\_Parastric}$, is defined as:

$$\omega_{P\_Parasitic} \approx \frac{1}{R_{C1}C_{O,1}} \tag{8}$$

as there is no design control over this parasitic pole. This upper value—which depends on the technology node—will determine the mechanism of scalability for higher stages. According to Eqn. (4), one can increase $\omega_t$ by increasing $A_{O,2}$ (i.e. the DC gain for N=2), $\omega_{P0}$, $\omega_{P1}$ and reducing $\omega_{Z1}$. However, since $A_{O,2}$ has already been selected based on the designed-for gain of the system, and $\omega_{P1}$ is fixed for a certain $C_L$ (here assumed to be 1 pF), one can increase $\omega_t$ by increasing $\omega_{P0}$ and decreasing $\omega_{Z1}$.

In one embodiment, increasing $\omega_t$ can be achieved by increasing $\omega_{P1}$, or, in other words, by reducing the value of $C_{C1}$ according to Eqn. (6). The new position of $\omega_{P1}$ after reducing $C_{C1}$ is shown (in solid lines) in FIG. 3A. Pushing $\omega_{P1}$ to higher frequencies, by reducing $C_{C1}$, may allow $\omega_{P0}$ to become the 3-dB frequency of the OTA instead of $\omega_{P1}$ (i.e., $\omega_{P0}$ mainly depends on $g_{m,2}$ and $C_L$). This may become useful when increasing the $C_L$-drivability, as will be discussed further below. However, it may not be desirable to reduce the value of $C_{C1}$ alone because this may alter the stability of the OTA as $\omega_{P1}$ moves towards $\omega_{P0}$, and, at the same time, $\omega_{Z1}$ is shifted to higher frequencies (i.e., as depicted by Eqn. (7)). Therefore, the gain roll-off may drop to values around −40 dB/dec, and thus, the Phase Margin (PM) may also drop. However, if one can properly reposition $\omega_{Z1}$ (after reducing $C_{C1}$) according to Eqn (3), the zero may counteract the effect of the two poles on the gain-roll off and PM. As a result, the stability issue can be controlled and the new general expression of $\omega_t$ can be written as in Eqn. (4).

Figure 3A:
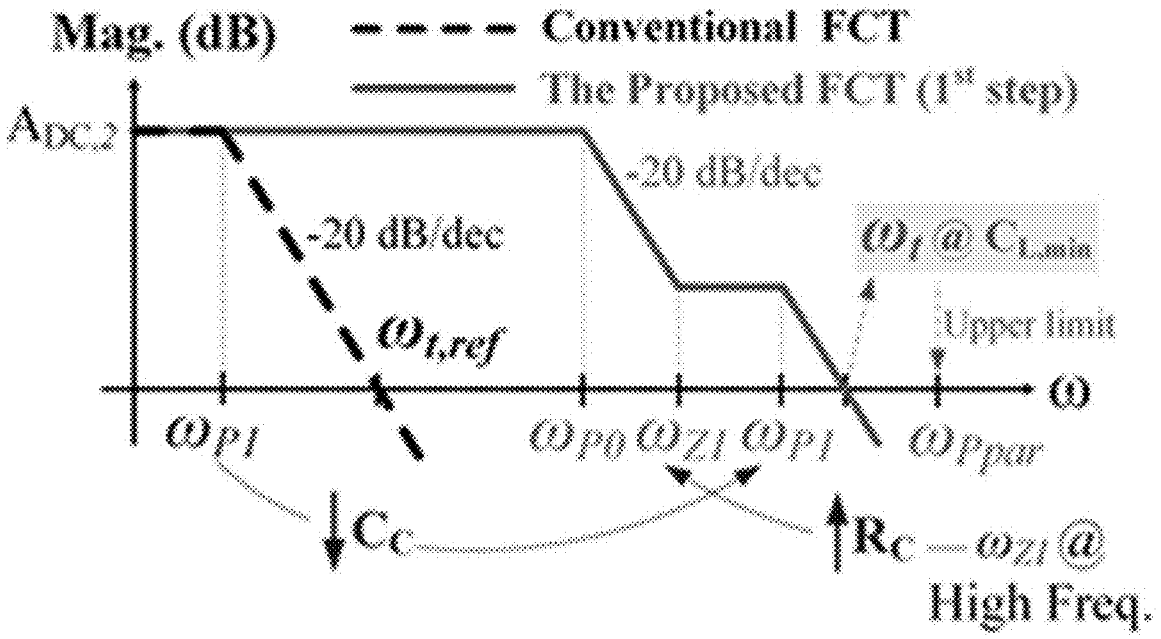
FIGS. 3A-3B illustrate the ideal AC open-loop response of a conventional Frequency Compensation Technique (FCT) versus the proposed FCT for N=2.
Figure 3B:
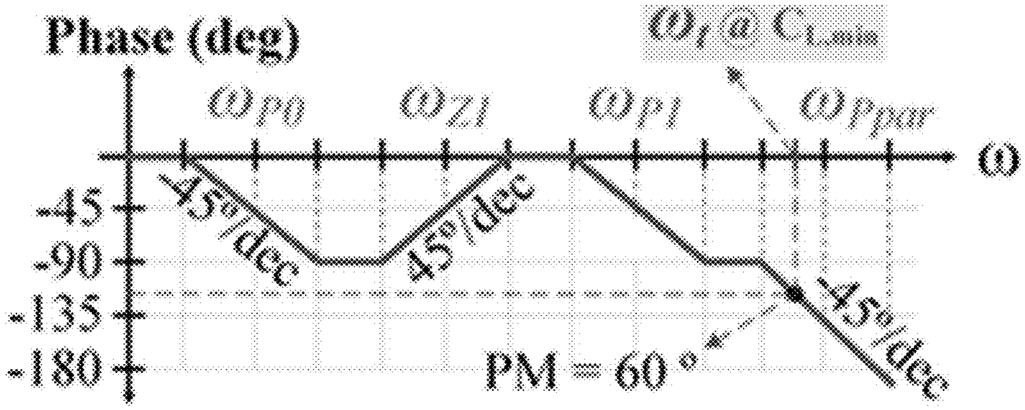

To re-position $\omega_{Z1}$ according to Eqn. (3) and shift it from higher to lower frequencies as seen in FIG. 3A, one can use a large compensation resistor $R_C$ (i.e., in the order of kΩ). As a result, the impact of the proposed FCT in this first step (i.e., step (1) of increasing $\omega_t$ under small $C_L$ using low-frequency zeros), compared to the conventional design, is shown in the AC response of FIG. 3A. Since $A_{O,2}$ is pre-defined, and $\omega_{P0}$ is almost independent of the R-C network, Eqn. (4) indicates that the maximum value of $\omega_t$ (i.e., near-optimum) can be achieved, ideally, by increasing $\omega_{P1}$ while decreasing $\omega_{Z1}$. However, the limitation of the upper value of $\omega_t$ is $\omega_{P\_Parasitic}$, seen in Eqn. (8) and FIG. 3A, as there is no full-design control over this parasitic pole. Also, it is desirable to increase $\omega_{P1}$ while decreasing $\omega_{Z1}$ so that the PM is greater than some desired value. For example, to obtain a PM of 60°, one can arrange the poles and zeros as shown in the AC phase response of FIG. 3B. Here, the PM is:

$$PM = 180 - \sum_{i=1}^{N-1}\theta_{P,i} + \sum_{i=1}^{N-1}\theta_{Z,i} \tag{9}$$

where $\theta_{P,i}$ is the phase of the $i^{th}$-pole and $\theta_{Z,i}$ is the phase of the $i^{th}$-zerd.

To achieve this at the circuit level, and according to Eqns. (5) and (7), one can start with a minimum value of $C_{C1,(2\text{-}stage)}$ (e.g., that is at least five times the maximum parasitic capacitance) given by a certain CMOS technology (i.e., slightly higher than $C_{O,1}$). Then, $R_{C1,(2\text{-}stage)}$ (~kΩ) is increased in value to achieve the required PM so that ($\omega_t \leq \omega_{P\_Parasitic}$), or until the value of $R_C$ becomes impractical in the given CMOS technology. This may allow the R-C circuit to occupy a small-silicon area. Also, increasing $\omega_t$ should be done such that the Phase Margin (PM) is greater than some desired value. At this point the design of the 2-stage OTA 202 is complete and values of $C_{C1,(2\text{-}stage)}$ and $R_{C1,(2\text{-}stage)}$ are shown in Table I.

TABLE I

| | $C_{C1}$ (pF) | $R_{C1}$ (KΩ) | $C_{C2}$ (PF) | $R_{C2}$ (KΩ) | $C_{C3}$ (PF) | $R_{C2}$ (KΩ) | $C_{C4}$ (PF) | $R_{C4}$ (KΩ) | $C_{C5}$ (PF) | $R_{C5}$ (KΩ) |
|---|---|---|---|---|---|---|---|---|---|---|
| 2-stage OTA | 0.05 | 180 | — | — | — | — | — | — | — | — |
| 3-stage OTA | 0.25 | 100 | 0.05 | 60 | — | — | — | — | — | — |
| 4-stage OTA | 0.5 | 80 | 0.25 | 60 | 0.05 | 50 | — | — | — | — |
| 5-Stage OTA | 2 | 60 | 0.5 | 40 | 0.25 | 40 | 0.05 | 60 | — | — |
| 6-stage OTA | 4 | 40 | 2 | 40 | 0.5 | 40 | 0.25 | 40 | 0.05 | 40 |

To design the 3-stage OTA, a new gain-stage is added to the 2-stage OTA, as depicted in FIG. 2A. Also, to design a 4-stage OTA, two gain-stages are added to the 2-stage OTA, and so on. Each new gain-stage comes with its own compensation circuit. Consequently, a new P-ZP will be added to the TF with each new stage as described in Eqn. (2). Also, according to Eqn. (4), $\omega_t$ will significantly increase, as $A_{O,N}$ will also increase. However, this new value of $\omega_t$ will most likely exceed the previously defined upper limit of $\omega_t$. Therefore, the value of $\omega_t$ is re-adjusted by re-positioning the poles and the zeros, according to Eqn. (3), whenever a new stage is added. This can be done by re-sizing the compensation circuit with the addition of each new stage.

Instead of deriving new equations for the poles and zeros for each stage separately, and by knowing that the P-ZPs have an inverse relationship with $R_C$ and $C_C$, the values which were found for the 2-stage OTA can be scaled to size the compensation circuits of higher OTA stages. Since the poles and zeros are positioned according to Eqn. (3) and since the maximum $\omega_t$ is defined, the sizes of the R-C compensation circuit components follow a certain pattern in order to position the P-ZPs when a new gain-stage is added. This scalable pattern can be seen in Table I and can be described as follows: whenever a new stage is added, the compensation resistors of the previous stage are reduced to increase the frequency of the zero of the new OTA stage, and hence reduce $\omega_t$ to its previously defined upper limit. Then, the values of the compensation resistors can be sized according to the following constraints:

$$R_{Ci,(N\text{-}stage)} \leq R_{Ci,[(N-1)\text{-}stage]}, 1 \leq i \leq N-1 \tag{10}$$

and $$R_{C(N-1),(N\text{-}stage)} \leq R_{C(N-2),(N\text{-}stage)} \tag{11}$$

where the new compensation resistor (i.e. $R_{C(N-1),(N\text{-}stage)}$) is initially sized according to the condition defined in Eqn. (11) to ensure that the new arrangement of the zeros follows the condition defined in Eqn. (3). For the compensation capacitors, the opposite pattern is followed. Whenever a new stage is added, the compensation capacitors of the previous stages are increased in size to decrease the frequency of the poles of the new OTA stage, and hence help in reducing $\omega_t$. The values of the compensation capacitors found for the 2-stage OTA can be adjusted according to the following constraint equations:

$$C_{C(i-1),(N\text{-}stage)} = C_{C(i-2),[(N-1)\text{-}stage]=}, 3 \leq i \leq N \tag{12}$$

and $$C_{Ci,(N\text{-}stage)} > C_{i,[(N-1)\text{-}stage]}, 1 \leq i \leq N-1 \tag{13}$$

Then, the new compensation capacitor (i.e. $C_{C(N-1),(N\text{-}stage)}$) is sized to the minimum capacitance value, which was found for the 2-stage OTA, as follows:

$$C_{C(N-1),(N\text{-}stage)} = C_{C1,(2\text{-}stage)} \tag{14}$$

Figure 3C:
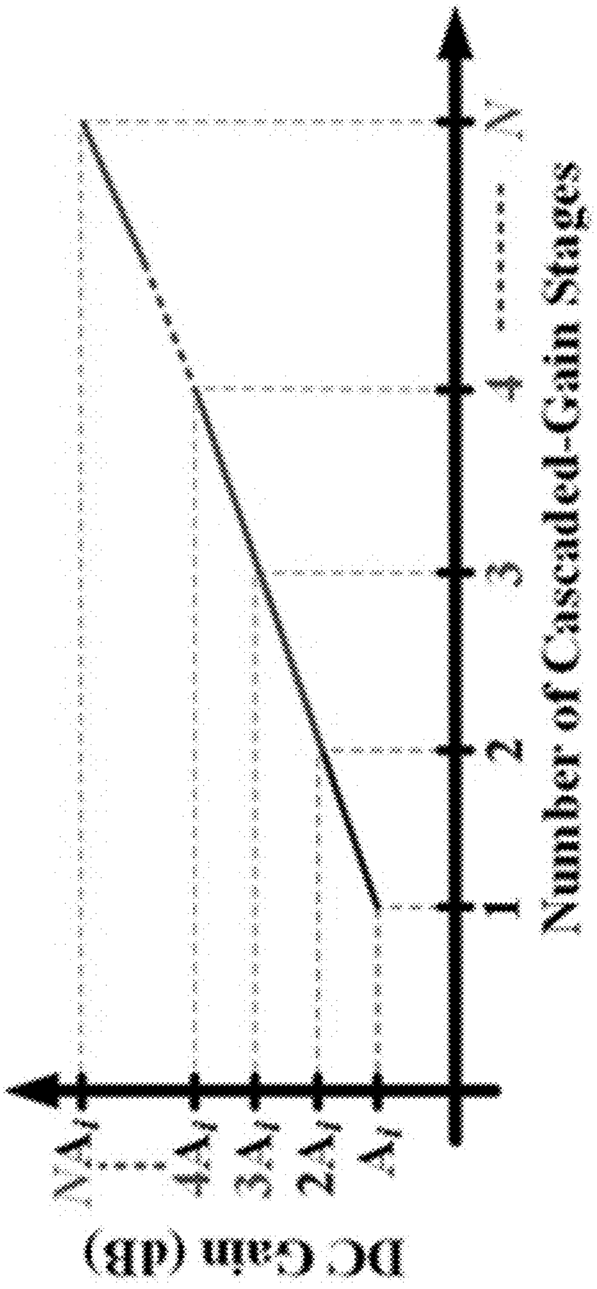
FIG. 3C is a graph illustrating the increase in DC gain with the increase in number of stages at $C_{L,min}$.

Since the constraint equations in Eqns. (10) to (13) show an intuitive technique of sizing the R-C compensation circuits for N≥3, and since there is no need for exact positioning of the poles and zeros, one can tweak these patterns to enhance the open-loop and closed-loop responses if necessary. For example, such tweaking can be done if an exact PM of 60° is required under $C_{L,min}$ of 0.5 pF. At this point the proposed scalable N-stage CMOS OTA is compensated to drive $C_{L,min}$ under the required PM. Also, as seen in FIG. 3C, the overall DC gain (in dBs) is increasing linearly with the addition of gain stages since all gain stage are providing the same DC gain of $A_i$.

Table I shows an example of the sizes of the compensation resistors ($R_C$) and compensation capacitors ($C_C$) for the different OTA stages. Apart from $R_{C4}$ in the 5-stage OTA, which is increased for better PM, all sizes follow Eqns. (10) and (14).

The approach described above may thus be used to obtain high DC gain through systematic positioning of the poles and zeros of the many-stage OTA circuit. As will be described further herein, the capacitive load ($C_L$) driving capability of any conventional CMOS OTA with an R-C network may be extended, from the pF range to the nF range, with near-optimum small and large signal time responses. The implementation of the proposed FCT to maximize $C_L$ for a desired settling time (referred to herein as step (2)) will now be described. As described further herein, this is achieved by positioning the Pole-Zero Pair (P-ZP), created by the R-C compensation network, below the unity-gain frequency ($\omega_t$) of the compensated OTA. On doing so, the P-ZP increases the value of $\omega_t$ for the compensated OTA. This additional increase in $\omega_t$ would then be traded-off for the capability of being able to drive higher loads, by placing the dominant pole at a higher frequency. This positioning of the P-ZP requires the compensation resistor ($R_C$) to be the dominant element of the chip size, while requiring the compensation capacitor ($C_C$) to be near the value of parasitic capacitances in the circuit. Accordingly, an area-efficient design is achieved.

The objective is to modify the positioning of the poles and the zeros of the two-stage OTA so that the capacitive load driving capability and the unity-gain bandwidth of the OTA are maximized, with the OTA exhibiting a stable closed-loop response. This is further constrained by requiring the settling time of a unity-gain closed-loop configuration to be bound by some value denoted by $T_S^D$. This can be mathematically expressed as follows:

$$\underset{\{\omega_{t,initial} \text{ and } C_L\}}{\text{maximize:}} \longrightarrow \underset{\{T_S < T_S^D\}}{\text{subject to:}} \tag{15}$$

where $\omega_{t,initial}$ is the initial value of the unit gain frequency $\omega_t$.

It should be noted that this problem includes both small and large-signal effects. Eqn. (15) contains a two-dimensional objective function involving $\omega_t$ and $C_L$, which are inversely inter-dependent. That is, if $C_L$ increases, $\omega_t$ decreases. This makes it difficult to identify the maximum. Instead, this design problem can be performed in two steps using the following sequential, non-iterative procedure. The first step is to solve the problem expressed as:

$$\underset{\{\omega_{t,initial}\}}{\text{maximize:}} \longrightarrow \underset{\{C_{L,min} = 0.5 \text{ pF}\}}{\text{subject to:}} \tag{16}$$

This can be performed using small-signal AC analysis, and hence takes little time to perform with a transistor-level simulator. This step places the poles and the zeros at desired frequency locations for maximum $\omega_t$ while having the minimum required capacitive load, $C_{L,min}$, (say 0.5 pF). Next, a transient analysis is performed on the OTA in a closed-loop configuration subject to an input step $V_{in}$ with different load conditions, i.e.:

$$\underset{\{C_L\}}{\text{maximize:}} \longrightarrow \underset{\{T_S < T_S^D \text{ for input step} = V_{in}\}}{\text{subject to:}} \tag{17}$$

While this can be executed in a sequential, non-iterative manner, the result is not optimal but orders of magnitude simpler to implement with improved results.

According to Eqn. (21) below, and since $A_O$ is pre-defined, the first step of boosting $\omega_{t,\ initial}$ is achieved by increasing $\omega_{P1}$, or, in other words, by reducing the value of $C_C$. The new value of $\omega_{t,\ initial}$ will be referred to as $\omega_{t,\ boosted}$. Pushing $\omega_{P1}$ to higher frequencies, by continuing to reduce $C_C$, allows $\omega_{P2}$ to become the 3-dB frequency of the OTA instead of $\omega_{P1}$. This may become useful when inserting the large $C_L$. However, reducing the value of $C_C$ only is not a desirable design practice because it may alter the stability of the OTA; where $\omega_{P1}$ may move towards $\omega_{P2}$, and at the same time $\omega_{Z1}$ may shift to higher frequencies (as can be seen from Eqn. (16)). Therefore, the gain roll-off may drop to values around −40 dB/dec, and thus, the Phase Margin (PM) may also highly drop. But, if one can properly re-position $\omega_{Z1}$, after reducing $C_C$, such that:

$$\omega_{P2}<\omega_{Z1}<\omega_{P1}<\omega_{t,boosted} \tag{18}$$

The zero counteracts the effect of the two poles on the gain-roll-off and the PM. As a result, the stability issue can be controlled and the new $\omega_{t,boosted}$ can be expressed as:

$$\omega_{t,boosted} = A_O\omega_{P2}\left(\frac{\omega_{P1}}{\omega_{Z1}}\right) \tag{19}$$

To re-position $\omega_{Z1}$ according to Eqn. (18), one can increase the value of $R_C$. As a result, the impact of modifying the R-C compensation network, compared to the conventional design, is shown in FIG. 3A.

Since $A_O$ is pre-defined, and $\omega_{P2}$ is almost independent of the R-C network, Eqn. (19) indicates that the maximum value of $\omega_{t,boosted}$ (i.e. near-optimum) can be achieved, ideally, by increasing $\omega_{P1}$ while decreasing $\omega_{Z1}$. However, the limitation of the upper value of $\omega_{t,boosted}$ is $\omega_{P3}$, seen in Eqn. (15), as there is no design control over this parasitic pole. Also, increasing $\omega_{P1}$ while decreasing $\omega_{Z1}$ should be done so that the PM is greater than some desired value (see FIG. 3B).

To achieve this at the circuit level, one can start with the minimum possible value of $C_C$ given by a certain CMOS technology (i.e. slightly higher than the parasitic capacitance $C_{parasitics}$). Then, $R_C$ is increased in value so that ($\omega_{t,boosted} \leq \omega_{P3}$), or until the value of $R_C$ becomes impractical in the given CMOS technology. Accordingly, with this, the first step of the design process, described by Eqn. (16), would have been completed.

Since the design achieved through step (1) was still loaded with a very small capacitance of 1 pF, the settling time of the closed-loop amplifier would be very short. Indeed it is assumed to be much shorter than the desired settling time $T_S^D$, and hence an increase in settling time can be traded-off for a higher $C_L$. To find this limit, one sweeps on the step response of the closed-loop amplifier beginning with the 1 pF load and increases it until the desired settling time is reached. The input can be driven with a step input whose magnitude can be in the small or large-signal range. There are no constraints on the input condition. At this point, the maximum $C_L$ has been identified, and the final $\omega_t$ becomes:

$$\omega_{t,final}=A_O\omega_{P2} \tag{20}$$

If $\omega_{t,final}$ does not meet the requirements on $T_S^D$, one can re-adjust the reference design of the OTA by optimizing the biasing voltages and the aspect ratios. If this still does not allow $\omega_{t,final}$ to meet the requirements on $T_S^D$, then a two-stage OTA is not suited for the given application.

Since the design achieved through step (1) is transferring the dependency of the dominant pole to $\omega_{P0}$ (i.e., $C_{L,min}$), it is desirable to distinguish between compensating the OTAs with $C_L$ only and the proposed FCT. Interestingly, one can remove the R-C compensation circuit and rely only on $C_L$ to position $\omega_{P0}$ below $\omega_t$ while leaving the P-Z pairs (i.e., $\omega_{P1}$, $\omega_{Z1}$, $\omega_{P2}$, $\omega_{Z2}$ . . . $\omega_{Pi}$ and $\omega_{Zi}$) without being controlled. On doing so, the stability can be achieved once $C_{L,min}$ is increased such that $\omega_t$ is shifted to frequencies much lower than the P-Z pairs. However, this technique is associated with some drawbacks. First, this technique is technology dependent, in other words, leaving the P-Z pairs without being controlled may allow the parasitic capacitances (which are technology dependent) to decide their frequency positions. Second, this technique works if a large $C_{L,min}$ is required (i.e., in the range of tens of nano-Farads). Also, this large $C_{L,min}$ is increasing with the addition of extra gain stages, due to the increase in $A_{O,N}$ (i.e., $\omega_t$). For these reasons and others, this dependency of the dominant pole on $C_L$ is not a desirable design practice in some embodiments. Nevertheless, this will not be an issue in the proposed FCT, since the P-Z pairs have already been positioned at the required frequencies. Consequently, one can define the range of $C_L$ that prevents the P-Z pairs from alternating the OTA's stability. To capture the shortage of relying on $C_L$ only to compensate the OTA, and to discuss the advantages of the proposed FCT in increasing $C_L$-drivability of the proposed OTA, FIG. 4 introduces the relationship between the PM and $C_L$.

Figure 4:
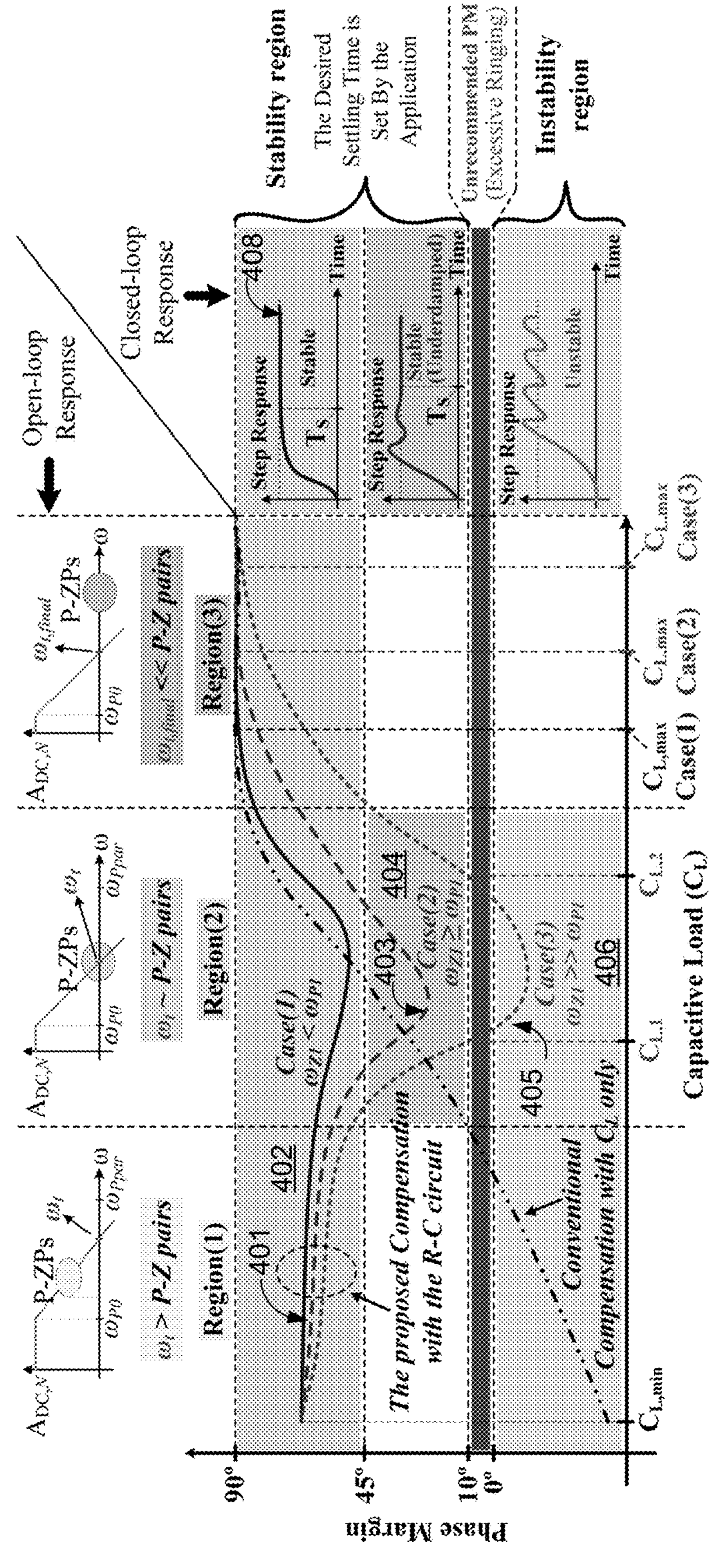
FIG. 4 is a graph illustrating phase margin vs. $C_L$, showing the impact of positioning the open-loop P-Z pair on the closed-loop step response of the proposed OTA of FIGS. 2A-2C.

The PM is an open-loop parameter that can indicate the closed-loop step response behavior. FIG. 4 shows how the PM is changing with the increase in $C_L$ based on different scenarios of positioning the OTA's poles and zeros in the proposed FCT. Accordingly, it indicates the behavior of the closed-loop step response.

Starting with the design that was loaded with a very small $C_L$ (i.e., $C_{L,min}$=0.5 pF) and achieved a sufficient PM (say 60°), the impact of increasing $C_L$ on the PM can be investigated. According to Eqn. (5), increasing $C_{L,min}$ will result in shifting $\omega_{P0}$ to lower frequencies, thus, shifting $\omega_t$ to lower frequencies as well. As can be seen in FIG. 4, this creates three different regions based on the new positions of $\omega_t$ with respect to the P-Z pairs. In each region the impact of increasing $C_L$ on the PM depends on the position of $\omega_{Zi}$ with-respect-to $\omega_{Pi}$, thus, three cases are created in each region. To clarify this, the cases when N=2 are considered and the PM behavior in these three regions based on the position of $\omega_{Z1}$ and $\omega_{P1}$ is discussed.

As illustrated in FIG. 4, Region (1), namely the region $\omega_t$>P-Z pairs, starts at $C_{L,min}$, where the OTA exhibits a stable response (as discussed in step (1) of the proposed FCT) and the P-Z pairs are positioned below $\omega_t$. As CL increases, $\omega_t$ moves towards the P-Z pair and a slight drop in the PM may occur. However, this does not affect the closed-loop response as the PM≥45°. Therefore, the impact of positioning $\omega_{Z1}$ with-respect-to $\omega_{P1}$ does not impact the OTA's stability in this region. Nonetheless, it is recommended to achieve sufficient values for PM in step (1) (i.e., PM≥60°) to expand this region as much as possible. This can be done by positioning $\omega_{Z1}$ at low frequencies. In this region, one can clearly distinguish between the proposed FCT and the conventional techniques that depend on $C_L$ only (i.e., the dashed-dotted black line in FIG. 4), where stability cannot be ensured at small values of $C_L$.

Still referring to FIG. 4, in Region (2), namely the region $\omega_t$~ P-Z pairs, once increasing $C_L$ to higher values, such that $\omega_t$ is located slightly above, in between, or slightly below the P-Z pair, the impact of positioning $\omega_{Z1}$ with-respect-to $\omega_{P1}$ becomes significant. In other words, according to Eqn. (9), if $\omega_{Z1}$ is positioned at low frequency (i.e., Case (1): $\omega_{Z1}$<$\omega_{P1}$), it will compensate the PM drop that will be caused by $\omega_{P1}$, and the PM will be kept above 45° (i.e., the solid line 401 in FIG. 4 is always within the area 402). However, $\omega_{Z1}$ will have less impact on the PM if it is positioned slightly above $\omega_{P1}$ (i.e., Case (2): $\omega_{Z1}$≥$\omega_{P1}$). Consequently, the PM might drop to values below 45° and above 10° (i.e., the dashed line 403 is entering the area 404 in FIG. 4). Nonetheless, the step response will exhibit a stable underdamped behavior, which will be seen as an increase in settling time. However, if $\omega_{Z1}$>>$\omega_{P1}$ (i.e., Case (3)), the PM drop (with the increase in $C_L$) might reach values below 10°, hence, the step response may become unstable within a specific range of $C_L$ (i.e., the dotted line 405 will enter the area 406 between $C_{L,1}$ and $C_{L,2}$ in FIG. 4). Although the step response might exhibit a stable response for 0°≤PM≤10°, it has been assumed unrecommended in FIG. 4 as it may be associated with excessive ringing. Interestingly, further increase in $C_L$, within Region (2), may allow $\omega_t$ to be at frequencies lower than the P-Z pair, thus, the PM may start increasing toward 90°.

Still referring to FIG. 4, region (3), where $\omega_t$<<P-Z pairs will now be described. Once the PM reaches 90°, the proposed FCT reaches its definition for the maximum capacitive load ($C_{L,max}$), because at PM=90°, the R-C compensation circuits will have no more impact on the design, and $C_L$ will compensate the OTA. Accordingly, one can define $C_L$-drivability ration as:

$$C_{L\text{-}drivability}=\begin{cases}10^{\left(\log_{10}\frac{C_{L,max}}{C_{L,min}}\right)}=\frac{C_{L,max}}{C_{L,min}}, & \text{for Case (1) and (2)}\\ 10^{\left(\log_{10}\frac{C_{L,max}}{C_{L,min}}-\log_{10}\frac{C_{L,2}}{C_{L,1}}\right)}=\frac{C_{L,max}}{C_{L,min}}\times\frac{C_{L,1}}{C_{L,2}}, & \text{for case (3)}\end{cases} \tag{22}$$

Since the P-Z pairs will have no impact on $\omega_t$ in this region, the unity-gain frequency will be referred to as $\omega_{t,final}$ (seen in FIG. 4) and it can be written as: ($A_{O,N}$ $\omega_{P0}$). Also, the step response will follow a single time constant behavior. The proposed OTA will exhibit a stable response once increasing $C_L$ beyond $C_{L,max}$, where the PM will be 90°.

According to Eqn. (17), the range of $C_L$ that corresponds to a desired settling time will now be defined. For a design loaded with a very small capacitance (i.e., $C_{L,min}$=0.5 pF), the settling time ($T_{S,initial}$) of the closed-loop amplifier would be very short. Indeed, it is assumed to be much shorter than the desired settling time $T_S^D$, and hence an increase in settling time can be traded-off for a higher $C_L$. Knowing that $T_S^D$ is widely varying based on the required application, one can define a range of $C_L$'s that corresponds to a range of different settling time values by searching on the step response of the closed-loop amplifier beginning with $C_{L,min}$. This can be simply done by increasing $C_L$, starting from $C_{L,min}$, until the desired settling time is reached, as long as $C_L \le C_{L,max}$. At this point, the desired $C_L$ ($C_{L,desired}$) can be identified. Here, $V_{in}$ can be driven with a step input whose magnitude can be in the small or large-signal range. There are no constraints on the input condition. Increasing $C_L$, starting from $C_{L,min}$, may result in different closed-loop responses based on the P-Z pair's positions, as can be seen on the right hand side of FIG. 4. Therefore, FIG. 5 builds on these different cases on positioning the P-Z pairs and indicates the relationship between settling time and $C_L$.

Figure 5:
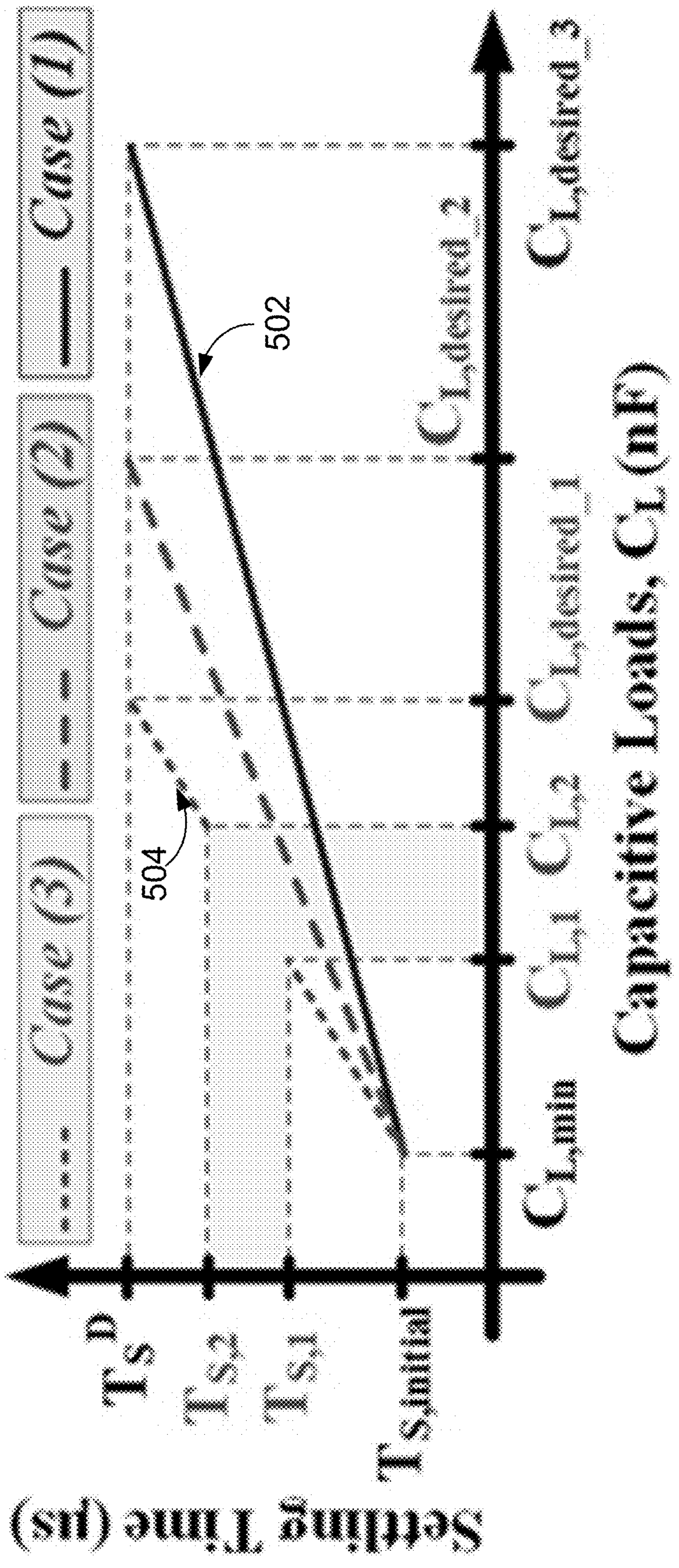
FIG. 5 is a graph illustrating the relationship between settling time and $C_L$, showing different cases created based on the proposed FCT.

Referring now to FIG. 5, one sees the three curves that will be created as $C_L$ is increasing according to the P-Z pairs' positions. For all scenarios of positioning the P-Z pairs, settling time is increasing with the increase in $C_L$, however, when $\omega_{Z1} < \omega_{P1}$ the OTA will exhibits faster closed-loop response as the region of underdamping behavior will not be entered (this is was shown in the solid line 408 in FIG. 4 and now can be seen in the solid line 502 of FIG. 5). As for $\omega_{Z1} \ge \omega_{P1}$ and $\omega_{Z1} >> \omega_{P1}$, the closed-loop response will be partially experiencing stable-underdamped response (as seen in FIG. 4), which will result in slower settling times. Consequently, for the same $T_S^D$ the case of positioning $\omega_{Z1}$ at low frequencies will achieve higher $C_L$-drivability, as $C_{L,desired}$ will be larger (i.e., $C_{L,desired,3} > C_{L,desired,2} > C_{L,desired,1}$ in FIG. 5). But, for the case when $\omega_{Z1} >> \omega_{P1}$ (i.e., dotted line 504 of FIG. 5) the OTA will not be stable between $C_{L,2}$ and $C_{L,1}$ as the PM might drop to values below 0° (the shaded area 406 of FIG. 4). If the $C_L$ range between $C_{L,min}$ and $C_{L,max}$ does not meet the requirements on $T_S^D$, one can re-adjust the reference design of the OTA by optimizing the biasing voltages and the transistors' aspect ratios. If this still does not allow the proposed technique to meet the requirements on $T_S^D$, then the proposed OTA is not suited for the given application.

To verify the proposed scalable OTA design, simulations were performed where the proposed 2-, 3-, and 4-stage OTA designs have been compared with previously reported different OTA designs. Measurement-based works, where CMOS OTAs can drive a wide range of $C_L$S (i.e., not only a single $C_L$ driving capability), have been reported.

Figure 14:
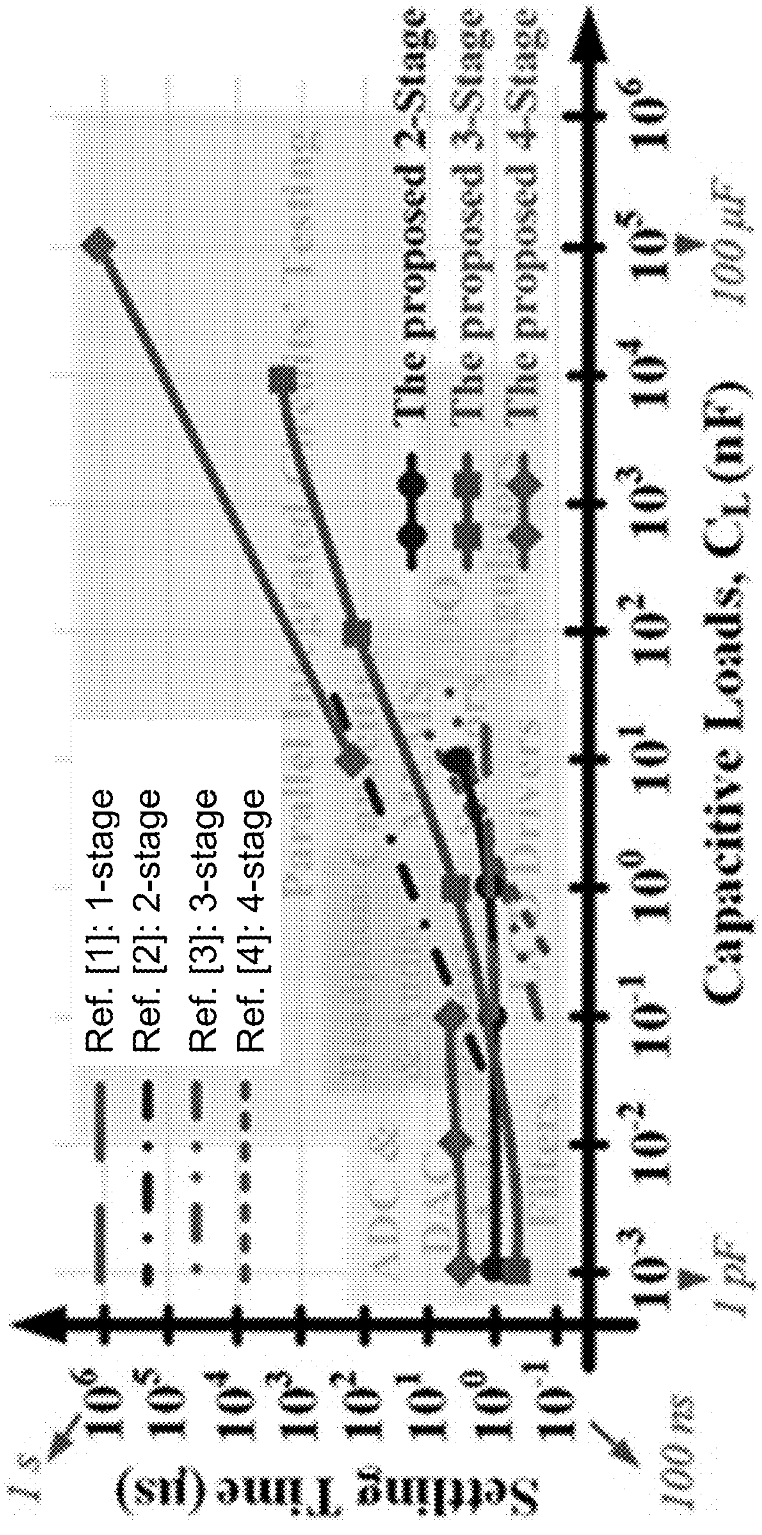
FIG. 14 is a graph comparing the proposed OTA designs with previously reported works in terms of $C_L$ drivability.

The results of the comparison highlight the need for an OTA with wide-ranging drivability features, even if the OTA settles in seconds. FIG. 14 superimposes a load-drivability summary of the OTA results with the best results found in the literature, referred to in FIG. 14 as Ref. [1], Ref. [2], Ref. [3], and Ref. [4], as it compares with various applications. Ref. [1] is S. W. Hong G. H. Cho, "A Pseudo Single-Stage Amplifier with an Adaptively Varied Medium Impedance Node for Ultra-High Slew Rate and Wide-Range Capacitive-Load Drivability," IEEE Trans. Circ. Syst.I, vol. 63, no. 10, pp. 1567-1578, October 2016. Ref. [2] is Z. Yan, P. Mak and R. P. Martins, "Two Stage Operational Amplifiers: Power and Area Efficient Frequency Compensation for Driving a Wide Range of Capacitive Load," in IEEE Circuits and Systems Magazine, vol. 11, no. 1, pp. 26-42, First Quarter 2011. Ref. [3] is J. Riad, J. J. Estrada-Lopez, I. Padill-Cantoya, and E. Sanchez-Sinencio, "Power-Scaling Output-Compensated Three-Stage OTAs for Wide Load Range Applications" *IEEE Trans. Circuits Syst. I Regul. Pap.*, vol. 67, no. 7, pp. 2180-2192, July, 2020. Ref. [4] is S. A. Fordjour, J. Riad, and E. Sánchez-Sinencio, "A 175.2-mW 4-Stage OTA With Wide Load Range (400 pF-12 nF) Using Active Parallel Compensation," *IEEE Trans. on VLSI*, vol. 28, no. 7, pp. 1621-1629, July 2020. As is clearly evident from FIG. 14, the proposed OTAs cover more applications than any other reported work. In addition to the simplicity of the proposed design which uses conventional gain stages with multi-Miller R-C compensation circuits across gain stages, the proposed FCT is applicable to 2-, 3-, and 4-stage OTAs. This is a feature that is not available in existing techniques. In one embodiment, this may offer wider design choices for DC gain and power consumption for different applications.

For the purpose of comparing the present design method with prior design methods, a small signal figure-of-merit ($FOM_S$) and a large signal figure-of-merit ($SIFOM_L$) are defined as:

$$FOM_S = \frac{GBP \cdot C_L}{\text{Power}} \tag{24}$$

$$SIFOM_L = \frac{GBP \cdot C_L}{T_S \cdot \text{Power}}$$

The comparison shows that the proposed 3-stage OTA outperforms other reported works in FOMS and $SIFOM_L$, then comes the proposed 2-stage OTA. As for the proposed 4-stage OTA, it outperforms other 4-stage designs in its FOMS, but it has a low $SIFOM_L$ at $C_{L,max}$=100 μF due to the long settling time of such large $C_L$. Also, looking at the OTAs' metrics individually, one can see that the proposed 4-stage OTA has the highest $C_{L,max}$ of 100 μF. Moreover, the proposed 3-stage and 4-stage OTA have the maximum CL drivability of 1,000,000×, followed by the proposed 2-stage OTA with a CL drivability of 10,000×. Finally, the proposed differential-ended 2-stage OTA occupies the smallest silicon area of 0.0021 $mm^2$.

To further verify the proposed design technique, the standard TSMC 65 nm CMOS process was used to design the OTA of FIG. 2C with a supply voltage ($V_{DD}$) of 1 V, and the proposed FCT was verified for the 2-stage, 3-stage, and 4-stage OTAs for sake if simplicity. Each stage was designed to achieve a DC gain of about 25 dB and the 2-stage, 3-stage, and 4-stage OTAs of FIG. 2C was providing a post-layout $A_O$ of 51.18 dB, 77.2 dB, and 92 dB, respectively. To achieve this, the gain stages were biased with gate voltages at about 0.5 V (i.e, $V_{DD}/2$) and the CS transistors were designed to be identical with the sizes shown in FIG. 2C. Also, the current source transistors (i.e., $M_5$ and $M_{7,i}$) were biased at $I_{BIAS}$=6 μA. Consequently, $g_{m,M2}$=112.2 μA/V, $g_{m,M4}$=113.6 μA/V, $g_{m,M6}$=540.9 μA/V, $g_{m,M7}$=695.7 μA/V, $r_{O,M2}$=70.23 kΩ, $r_{O,M4}$=68.4 kΩ, $r_{O,M6}$=11.96 kΩ, and $r_{O,M7}$=12 kΩ.

Figure 2D:
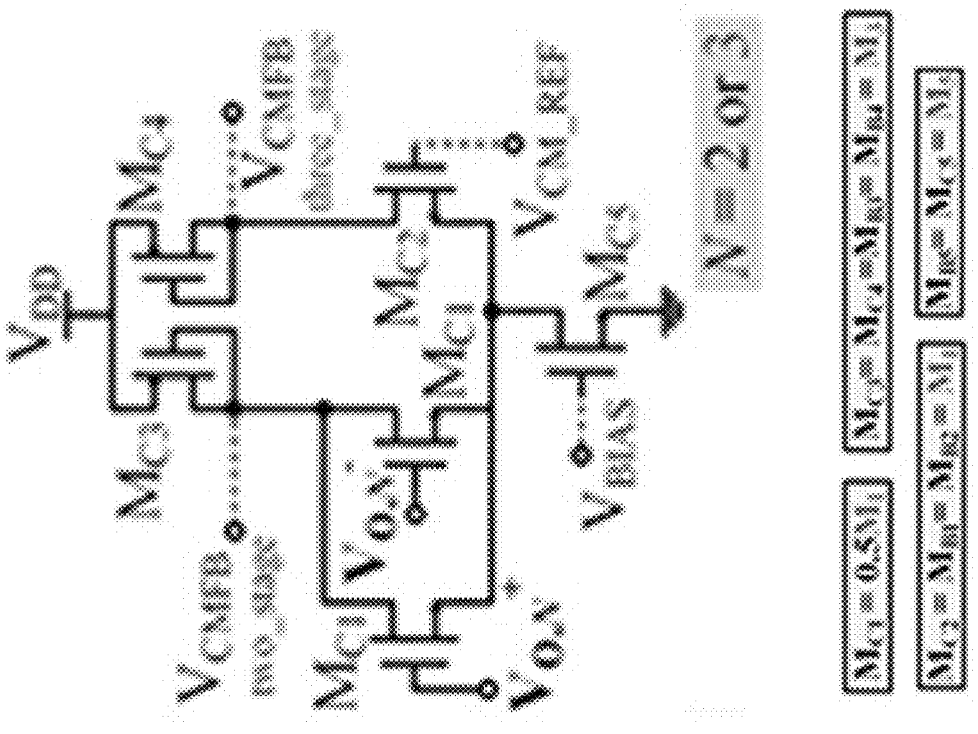
FIG. 2D illustrates a common mode feedback circuit used for N=2 or 3.
Figure 2F:
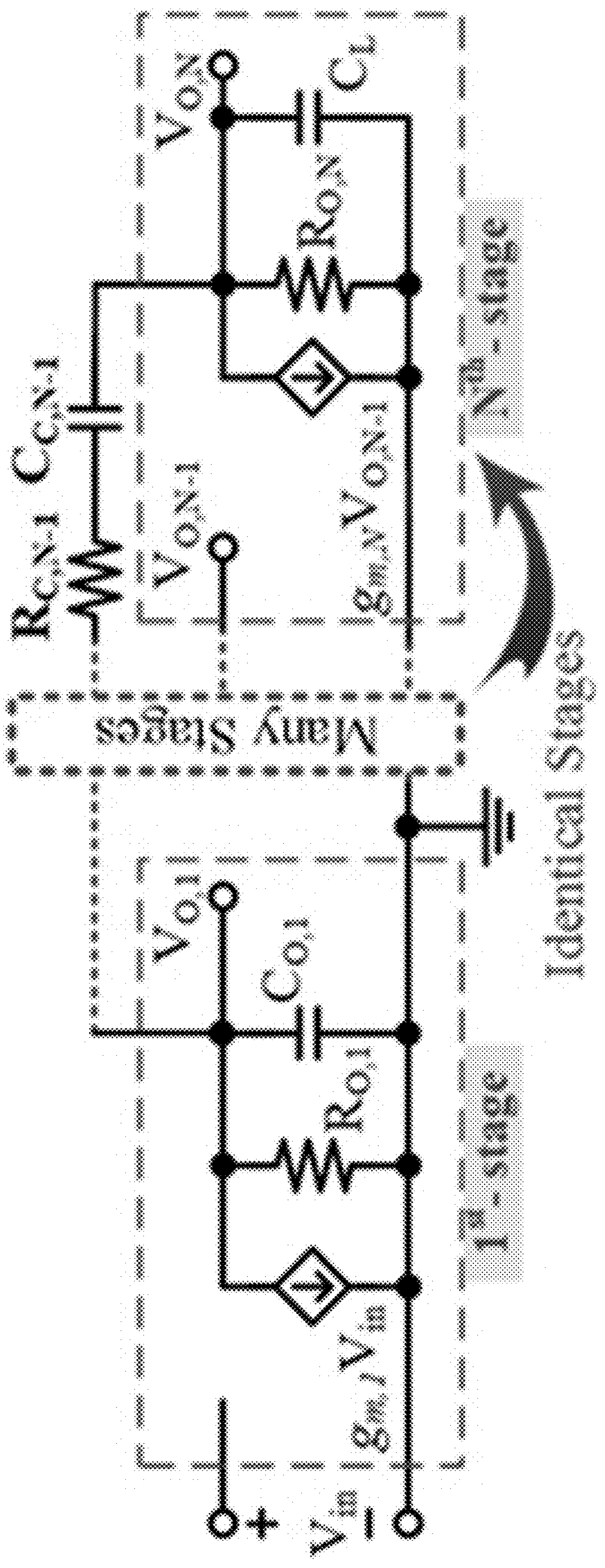
FIG. 2F illustrates a single-ended small-signal model of the proposed OTA of FIGS. 2A-2C.
Figure 6:
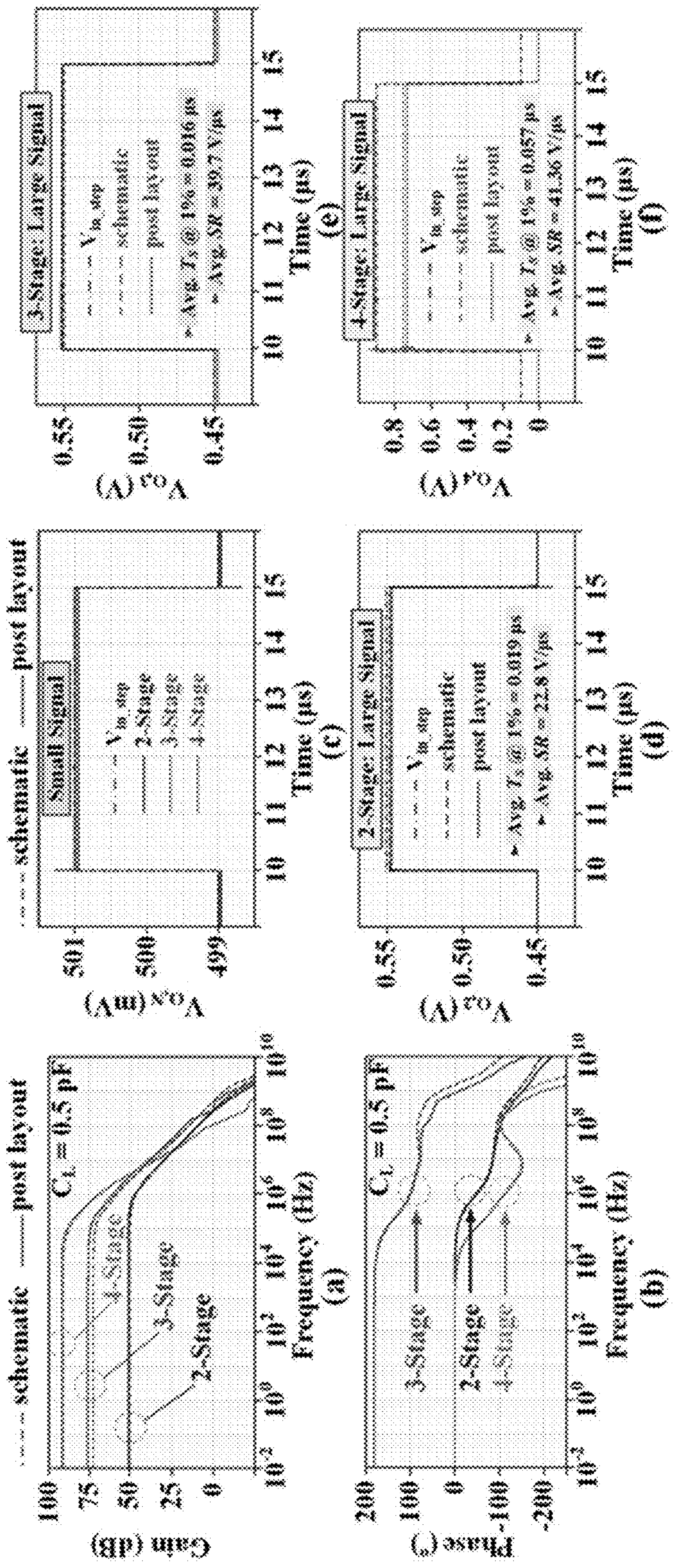
FIG. 6 illustrates schematic and post-layout simulations of the open-loop and unity-gain closed-loop configurations of the differential-ended 2-, 3-, and 4-stage CMOS OTA of FIG. 2C after implementing the proposed FCT under $C_L$=0.5 pF.

For the 2- and 3-stage OTA, the CMFB circuit of FIG. 2D was used, while the CMFB circuit of FIG. 2E was also added for the 4-stage OTA with $I_{BIAS\_1}$=3 μA. Due to the loading effect of the CMFB circuit of FIG. 2E, the 4-stage OTA has achieved an $A_{O,4}$ of 92 dB instead of values around 100 dB. The $A_O$ values for all stages are shown in FIG. 6(*a*).

Once the OTA is designed for the required DC gain, the proposed FCT is verified by designing the compensation circuits according to steps (1) and (2) (i.e., Eqns. (16) and (17)), so that $\omega_t$ is enhanced to a near-optimum value to allow the OTA to drive a wide $C_L$ range.

The proposed FCT starts by designing the 2-stage OTA's R-C compensation circuit (according to step (1)) having $C_{L,min}$=0.5 pF. Therefore, the value of $C_{C1,(2\text{-}stage)}$ has been selected to be almost 5 times the value of the parasitic capacitance given by the technology (i.e. $C_{C1}$=50 fF). For $R_{C1,(2\text{-}stage)}$, the value has been swept starting from 1 kΩ, and kept increasing till $R_{C1,(2\text{-}stage)}$ reached a value of 21 kΩ. Thus, $\omega_t$ has become 293.2 MHz. This value of $\omega_t$ is near optimum as PM=70.9°, which is a reasonable value to indicate stability. The frequency positions of the poles and the zero after designing the 2-stage OTA's R-C circuit according to step (1) are shown in Table II below.

TABLE II

| OTA Stage | Poles & Zeros | | | | | | |
|---|---|---|---|---|---|---|---|
| | | 1st P-Z pair | | 2nd P-Z pair | | 3rd P-Z pair | |
| | Bandwidth $f_{P\_3dB}$ (KHz) | $f_{P1}$ (MHz) | $f_{Z1}$ (MHz) | $f_{P2}$ (MHz) | $f_{Z2}$ (MHz) | $f_{P3}$ (MHz) | $f_{Z3}$ (MHz) |
| Two-Stage | 846.6 | 180.5 | 166.3 | — | — | — | — |
| Three-Stage | 191.1 | 10.06 | 15.03 | 167 | 165.4 | — | — |
| Four-Stage | 89.51 | 1.8 | 14.58 | 12.4 | 29.1 | 59.4 | 32.1 |
| | | | | $f_t$ (MHz) | $f_{par}$ (GHz) | PM (°) | |
| #Two-Stage | | | | 293.2 | 0.787 | 70.9 | |
| Three-Stage | | | | 548.2 | 1.527 | 57 | |
| Four-Stage | | | | 288.4 | 1.192 | 67.1 | |

Clearly, these values are satisfying Eqn. (3) and the parasitic pole is twice the value of $\omega_t$. Following the scalable technique given by Eqs. (10) to (13), the R-C compensation circuits of the 3- and 4-stage OTAs are designed as shown in Table III below.

TABLE III

| | Components | | | | | |
|---|---|---|---|---|---|---|
| | Compens. Caps. (pF) | | | Compens. Resistor (KΩ) | | |
| OTA Stage | $C_{C1}$ | $C_{C2}$ | $C_{C3}$ | $R_{C1}$ | $R_{C2}$ | $R_{C3}$ |
| Two-Stage | 0.05 | — | — | 21 | — | — |
| Three-Stage | 0.25 | 0.05 | — | 44* | 21 | — |
| Four-Stage | 0.5 | 0.25 | 0.25* | 12.6 | 44 | 21 |

Based on these values, Table II shows all open-loop frequency parameters. Even though Eqn. (3) has not been fully satisfied for 3- and 4-stages, where some P-Z pairs are having $\omega_{Pi}$ at frequencies less than $\omega_{Zi}$, the PM has reached values around 60°. Also, $\omega_t$ is at high frequencies and the parasitic poles are still higher than $\omega_t$.

FIG. 6 summarizes all schematic and post-layout results for open-loop and closed-loop configurations after implementing step (1) of the proposed FCT under $C_L$=0.5 pF. Due to the inverse relationship between Slew Rate (SR) and the capacitors $C_{C,(N-1)}$ and $C_L$, and since the value of $C_L$ is higher than $C_{C(N-1)}$, the SR will be determined by the current $I_{M6,N}$ flowing in the CS transistor of the last gain stage (i.e., $M_{6,N}$) and $C_L$. Thus, the SR can be approximated as:

$$SR \approx \frac{I_{M6,N}}{C_{C,(N-1)} + C_L} \tag{25}$$

If a very large $C_L$ is required, one can increase the value of $I_{M6,N}$ to keep the SR within sufficient values. However, by designing the OTA to have a high $I_{M6,N}$, the power consumption may increase. This will become a trade-off between $C_L$, SR, and power consumption. The post-layout power consumption in the proposed designs is 106 μW, 180.1 μW, and 243.5 μW for the 2-, 3-, and 4-stage OTAs, respectively. Also, one should consider that this value is for a fully differential-ended topology.

Even though many resistors are being used in the proposed OTAs, the noise has not been affected that much, because the resistors mainly affect the noise of the output stage, while the 1st stage noise is the dominant noise. Therefore, the post-layout input referred noise at 10 kHz is 82.2 nV/√Hz for the 2- and 3-stage OTAs and 78.1 nV/√Hz, for the 4-stage OTA.

Figure 7:
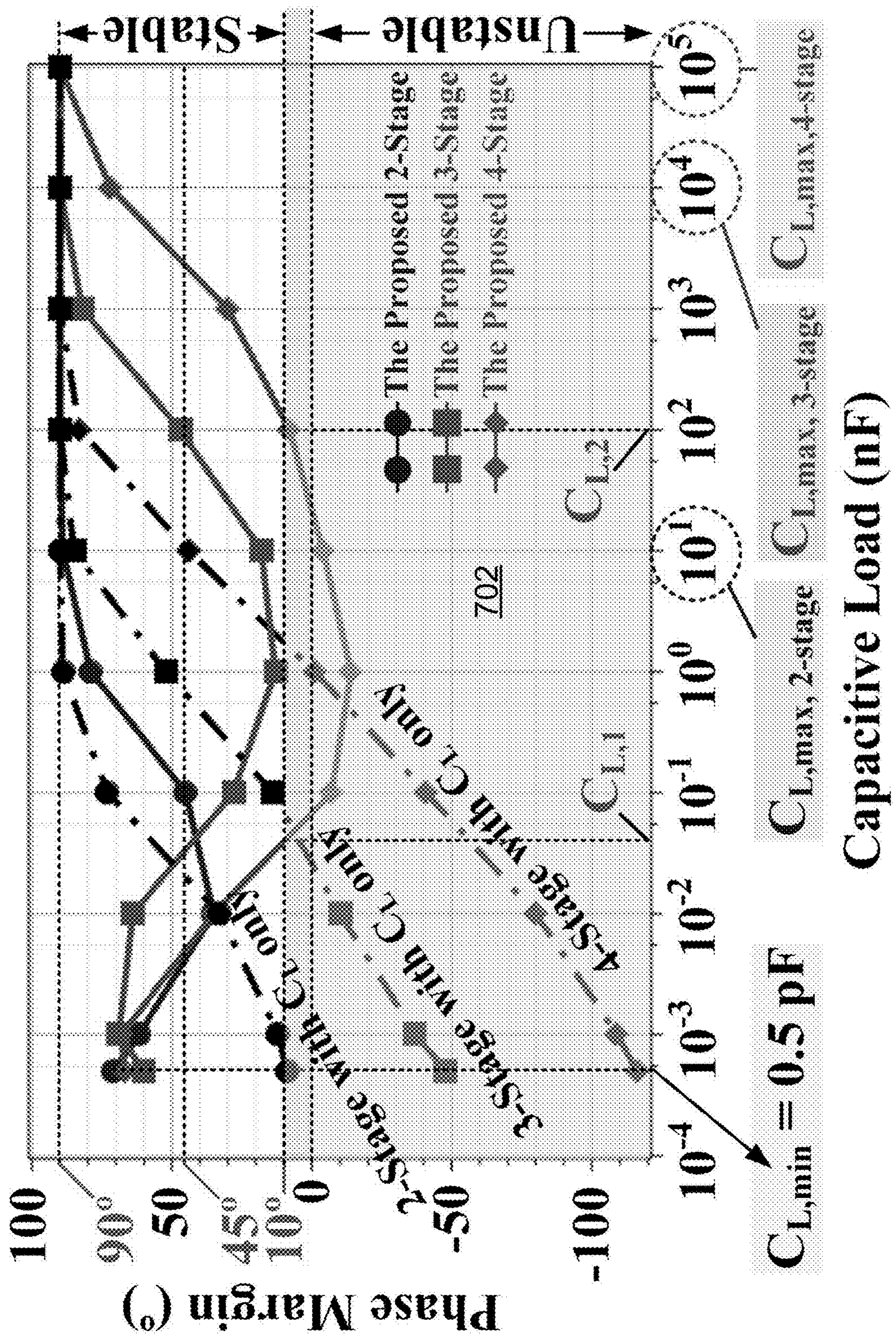
FIG. 7 illustrates the relationship between PM and $C_L$ as described in FIG. 4.

After designing the proposed OTAs to properly drive $C_{L,min}$ of 0.5 pF, the goal is to define the range of $C_L$ under which the 2-, 3-, and 4-stage OTAs' closed-loop responses are stable, and to find the corresponding settling time for this range of $C_L$. Therefore, similar steps of creating FIG. 4 and FIG. 5 (i.e., investigating the PM and the settling time variations vs. the increase in $C_L$) can be followed. Consequently, FIG. 7 shows the simulation results of PM vs. $C_L$. These results show that, in one embodiment, the proposed 2-stage OTA (solid line with circles) is stable with PM≥45°, for all values of $C_L$, except between 10 pF to 100 pF where the proposed 2-stage OTA goes slightly below 45°. Therefore, it mainly follows Case (1) of FIG. 4, which is the expected response since $\omega_{Z1}<\omega_{P1}$ (as reported in Table II). To define $C_{L,max}$, one can observe the $C_L$ value of FIG. 7 at which the PM becomes 90°. Clearly, $C_{L,max}$ is 10 nF; thus, the $C_L$ drivability ratio according to Eqn. (22) is 20,000.

As for the proposed 3-stage OTA, the closed-loop response is always stable as the PM does not reach the instability region (i.e., shaded area 702 of FIG. 7) with the increase in $C_L$. Clearly, the PM follows Case (2) of FIG. 4, which is an expected response since $\omega_{Z1}>\omega_{P1}$ of the 1st P-Z pair in Table II. Interestingly, with $C_{L,max}$ of 10 μF, the $C_L$ drivability ratio of the proposed 3-stage OTA is 20,000,000.

As for the proposed 4-stage OTA, the PM behavior follows Case (3) of FIG. 4, where it goes below 10° in between $C_{L,1}$=40 pF and $C_{L,2}$=100 nF. Again, this is an expected behavior due to the 1st and 2nd P-Z pairs' arrangement which can be seen in Table II (i.e., $\omega_{Z1}>>\omega_{P1}$). Nonetheless, the proposed 4-stage OTA is operating properly under all other values and exhibiting a $C_L$-drivability ratio of 8000.

To clearly measure the improvement that has been done by the proposed FCT on $C_L$-drivability of CMOS OTAs, one can compensate the proposed OTAs with the conventional FCT (i.e., which relies on $C_L$ only to compensate the OTA) and compare the results. FIG. 7 shows the PM behavior once conventional techniques are used to compensate for the proposed 2-, 3-, and 4-stage OTAs (i.e., the dashed-dotted lines in FIG. 7). Clearly, the conventional technique might only work for 2-stage OTA, but it cannot be scaled for higher number of stages (i.e., it is not suitable for scaled-down CMOS technologies) unless large $C_L$s are only required, which is not the case in most applications.

Figure 8:
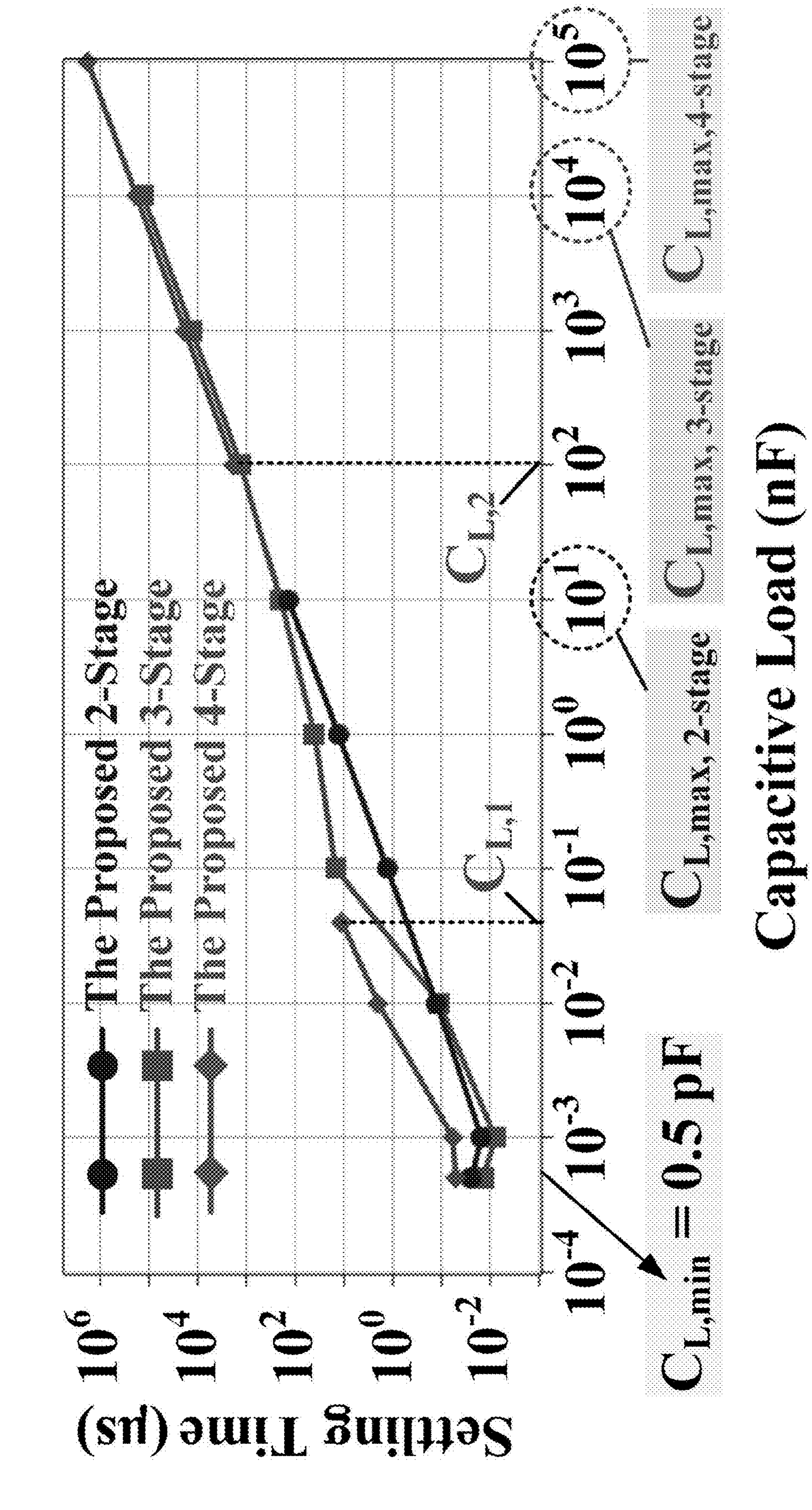
FIG. 8 illustrates the relationship between settling time and $C_L$ as described in FIG. 5.

The results in FIG. 7 pave the way to verify the unity-gain closed-loop step-response of the proposed OTAs to find the relationship between settling time and $C_L$. Since the settling time is expected to vary based on the different cases of positioning the open-loop P-Z pairs as stated in FIG. 5, the 2-stage OTA is expected to have the fastest response as it mostly follows Case (1). FIG. 8 verifies this for all $C_L$ values above 100 pF. However, although the 3-stage OTA is following Case (2), it exhibits faster response for $C_L$ values below 100 pF. The reason for this can be indicated from FIG. 7, where the 3-stage OTA is having higher PM values than the 2-stage OTA in between 1 pF to 100 pF.

Figure 9:
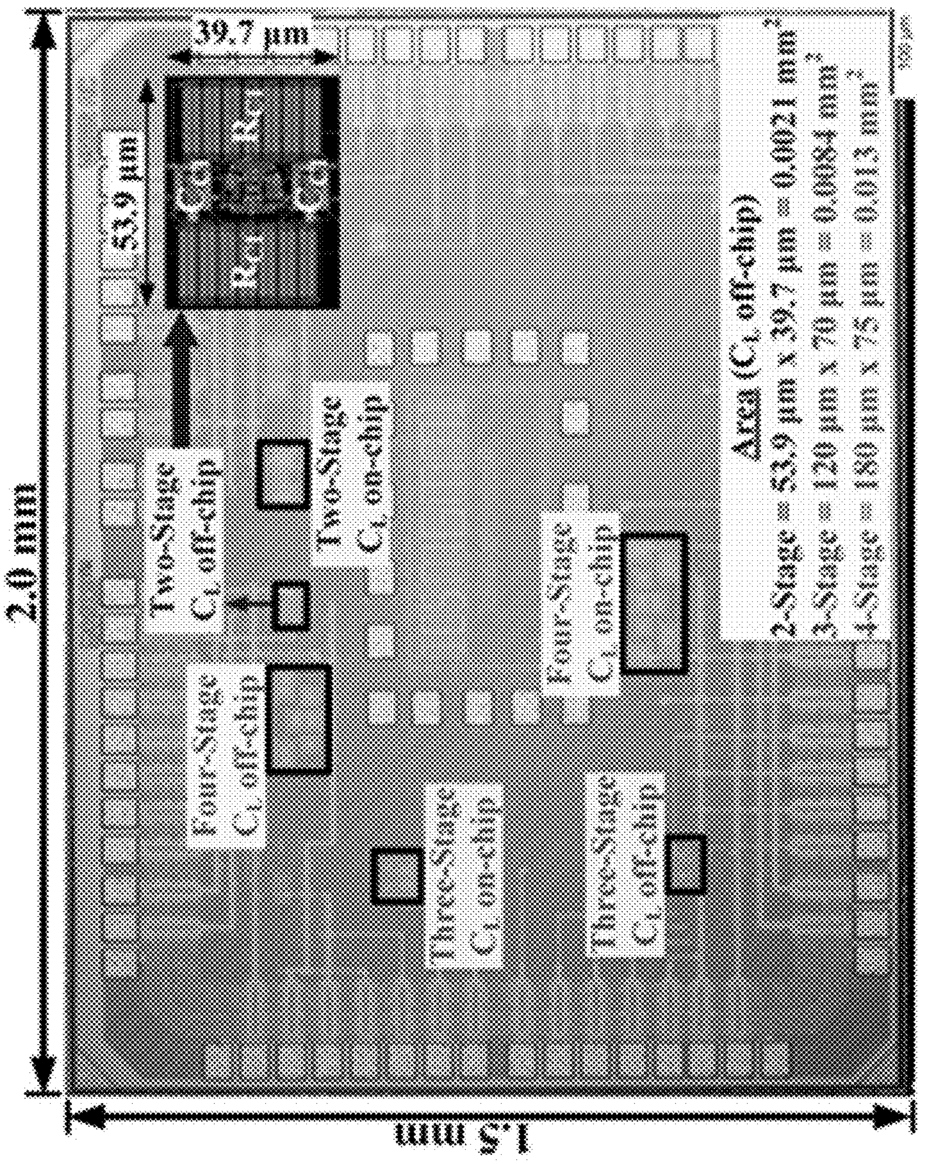
FIG. 9 illustrates a chip's microphotograph showing the proposed differential-ended 2-, 3- and 4-stage CMOS OTAs with $C_L$ on- and off-chip for each OTA.

FIG. 9 shows the fabricated chip's microphotograph. Since a wide range of CL is required, each proposed OTA has been fabricated twice (i.e., with $C_L$ on-chip for a small $C_L$=1 pF and $C_L$ off-chips for higher values). To illustrate the area and the elements in fabricating the proposed differential-ended 2-, 3-, and 4-stage CMOS OTAS, the layout drawing of the 2-stage OTA is embedded and enlarged in FIG. 9, where the overall dimensions is 53.9 μm×39.7 μm, resulting in an area of 0.0021 mm2. As seen in FIG. 9, $R_{C1}$ dominates the chip's size and occupies almost half the chip's silicon area. But, as $C_{C1}$ is set just above the parasitic level, the overall silicon area remains quite small (total area=0.0021 $mm^2$). The $R_C$ used here is the standard N-Well resistor with sheet resistance: $R_S$=316 (Ω/square). As for the $C_{C1}$, a mimcap with the same length and width of 4.8 μm is used for a $C_{C1}$ value of 50 fF. The same can be said for the 3- and 4-stage OTAs, except more silicon area is required as seen in FIG. 9.

Figure 10:
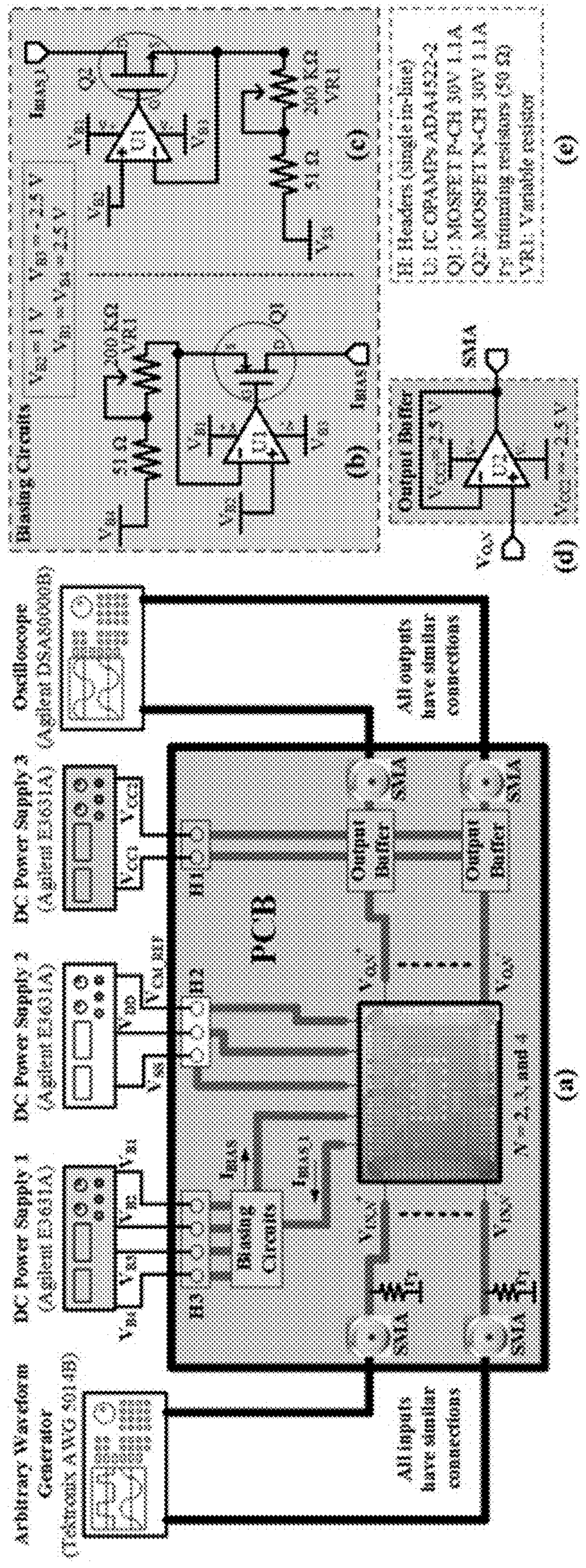
FIG. 10 illustrates a measurement setup for the OTA of FIGS. 2A-2C, where section (a) of FIG. 10 illustrates the testing equipment and the Printed Circuit Board (PCB), section (b) of FIG. 10 illustrates the biasing circuit to create $I_{BIAS}$, section (c) of FIG. 10 illustrates the biasing circuit to create $I_{BIAS\_1}$, section (d) of FIG. 10 illustrates the output buffer, and section (e) of FIG. 10 shows the off-chip components which are used to fabricate the PCB for testing purposes.

FIG. 10 shows a measurement setup used to evaluate the 2-, 3-, and 4-stage OTAs' operation, in accordance with one embodiment. The test equipment is shown in section (a) of FIG. 10 along with the PCB's main components. The off-chip biasing circuit and the output buffers are shown in sections (b), (c), and (d) of FIG. 10, respectively. In order to power all different components on the PCB, three separate power supplies have been used with the values shown in sections (b) and (c) of FIG. 10. Also, the off-chip PCB components are listed in section (e) of FIG. 10. This chip has been tested in a unity-gain closed-loop configuration to obtain the closed-loop and open-loop performance metrics of each OTA. Table IV below lists the critical OTA biasing parameters from a step response test involving a 100 mV step input.

TABLE IV

| Biasing Parameters | Two-Stage | Three-Stage | Four-Stage |
|---|---|---|---|
| $V_{CM\_REF}$ (V) | 0.43 | 0.47 | 0.5 |
| $V_{IN\_BIAS}$ (V) | 0.43 | 0.49 | 0.43 |
| $I_{BIAS}$ (μA) & | 27.2 & | 27.2 & | 27.2 & |
| $I_{BIAS\_1}$ (μA) | N/A | N/A | 13.6 |

Figure 11A:
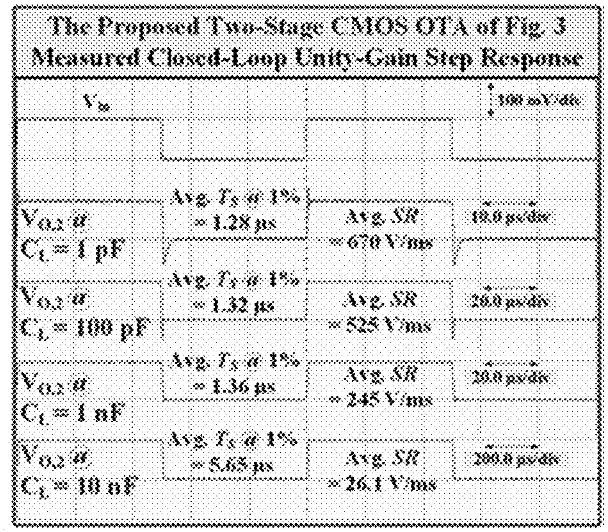
FIGS. 11A-C illustrate measurement results of the unity-gain closed-loop step response under different capacitive load values, where
Figure 11B:
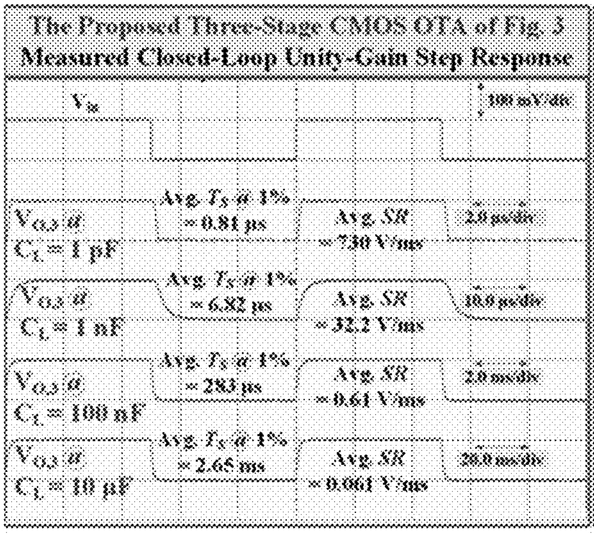
Figure 11C:
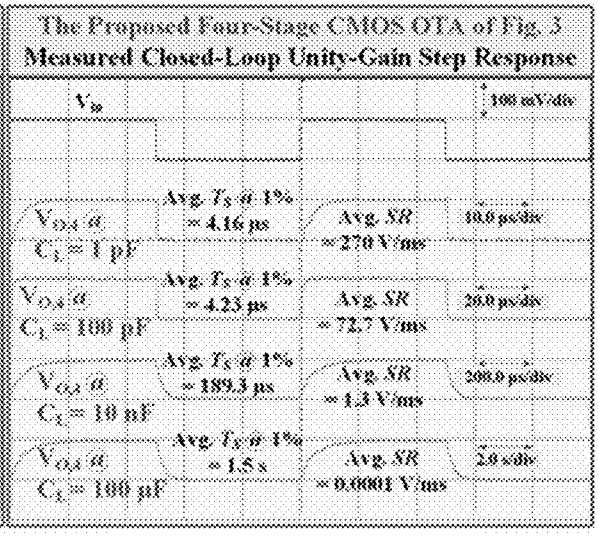
Figure 12:
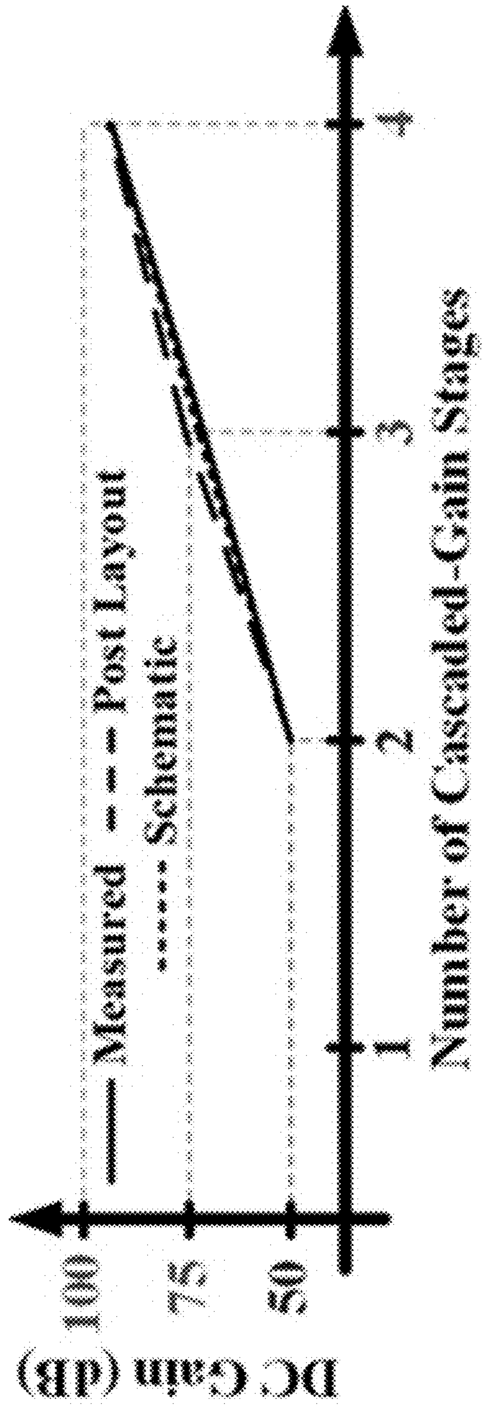
FIG. 12 is a graph illustrating DC gain vs. number of gain stages as described in FIG. 3C.

Subsequently, FIGS. 11A, 11B, and 11C show the output step response of the 2-, 3-, and 4-stage OTAs under different values of $C_L$ (i.e., starting from $C_{L,min}$ up to $C_{L,max}$) as captured by an Agilent DSA80000B oscilloscope. The closed-loop performance metrics (i.e. settling time and SR), for different values of $C_L$, are included on each time plot shown in FIG. 11. Also, FIG. 12 shows the DC gain of the proposed OTAs, and a summary of the open-loop measurements' results is shown in Table V below, for the proposed 2-, 3-, and 4-stage CMOS OTAs under $C_{L,min}$ and $C_{L,max}$ for each OTA.

TABLE V

| Metric | Two-Stage | | Three-Stage | | Four-Stage | |
|---|---|---|---|---|---|---|
| Power (μW) | 126.8 @ 1V | | 227.9 @ 1V | | 300 @ 1V | |
| $C_L$ | 1 pF | 10 nF | 1 pF | 10 μF | 1 pF | 100 μF |
| $f_{t,final}$ (MHz) | 6.17 | 0.06 | 7.75 | 0.0011 | 0.47 | 0.000002 |

By comparing these measurement results with the schematic and post-layout simulation results found during the verification, one can conclude that these results are in general agreement with one another. Thus, the proposed FCT is being applied properly. It should be noted, however, that the 4-stage OTA has a $C_{L,1}$ and $C_{L,2}$ values that is slightly different than what was predicted by simulation, i.e., 40 pF versus 100 pF for $C_{L,1}$, and 100 nF versus 10 nF for $C_{L,2}$.

Figure 13A:
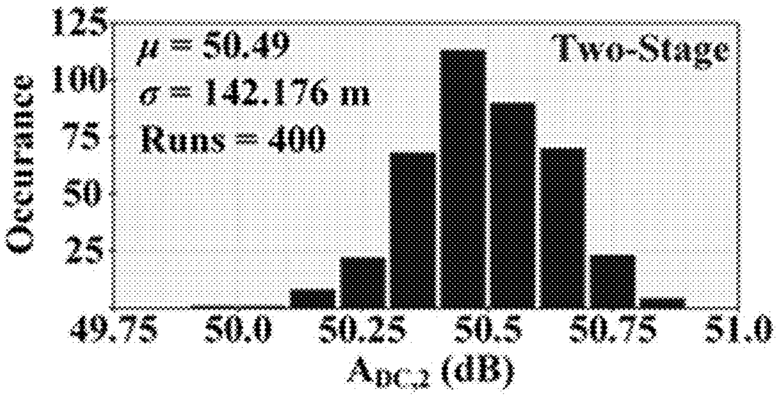
FIGS. 13A, 13B, and 13C illustrate schematic-based Monte-Carlo simulations of $A_{DC}$ for the proposed scalable OTA of FIGS. 2A-2C, where
Figure 13B:
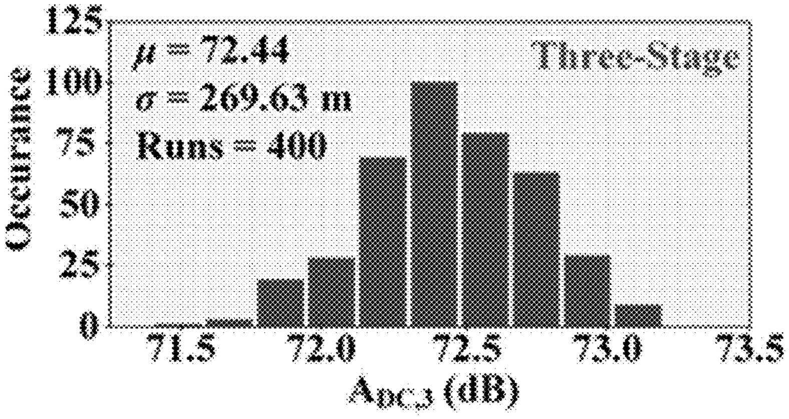
Figure 13C:
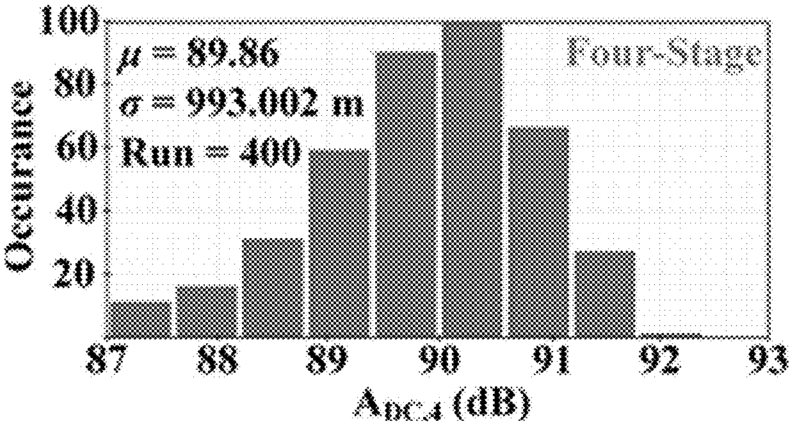

To ensure the robustness of the proposed design, excessive process corners and Monte-Carlo (MC) simulations have been conducted for different OTAs' parameters, under different $C_L$'S, in open-loop and closed-loop configurations. This was conducted for both schematic-based and post-layout-based designs. FIGS. 13A, 13B, and 13C shows a test for the design robustness using the schematic-based open-loop $A_O$ MC simulations for the 2-, 3-, and 4-stage CMOS OTAs. Here, a relative percent error of less than 1.5% is obtained. The same can be said for all other performance metrics. Moreover, to test the proposed OTAs robustness under PVT variations, the post layout-based process corners of the proposed 2-, 3-, and 4-stage OTAs under $C_L$ of 1 pF are conducted. Table VI reports the results of different performance metrics' behavior under these process corners.

TABLE VI

| Metric | Two-Stage SS | SF | TT | FS | FF |
|---|---|---|---|---|---|
| DC gain (dB) | 51.58 | 51.26 | 51.18 | 50.89 | 50.76 |
| Power (μW) @ 1 V | 98.2 | 101.2 | 106 | 110.6 | 113.4 |
| $f_t$ (MHz) | 143.2 | 151.3 | 157.7 | 163 | 175 |
| Phase Margin (°) | 54.1 | 54 | 53.8 | 54.2 | 55 |
| Avg. $T_s$ @ 1% (μs) | 0.056 | 0.042 | 0.025 | 0.015 | 0.018 |
| Avg. SR (V/μs) | 22.15 | 16.2 | 18.07 | 18.97 | 28.3 |
| Input-ref. noise (nV/√Hz) @ 10 kHz | 84.8 | 82 | 82.2 | 82.2 | 78.9 |

| Metric | Three-Stage SS | SF | TT | FS | FF |
|---|---|---|---|---|---|
| DC gain (dB) | 76.8 | 75.7 | 77.2 | 75.6 | 74.6 |
| Power (μW) @ 1 V | 172.4 | 179.8 | 180.1 | 193.8 | 201.9 |
| $f_t$ (MHz) | 218 | 235 | 242.8 | 248 | 261 |
| Phase Margin (°) | 50 | 53.5 | 53.1 | 53.1 | 54.3 |
| Avg. $T_s$ @ 1% (μs) | 0.017 | 0.02 | 0.009 | 0.015 | 0.013 |

TABLE VI-continued

| | | | | | |
|---|---|---|---|---|---|
| Avg. SR (V/µs) | 19.8 | 6.3 | 29.55 | 6.25 | 8.1 |
| Input-ref. noise ($nV/\sqrt{Hz}$) @ 10 kHz | 84.7 | 82 | 82.2 | 82.2 | 78.9 |

| | Four-Stage | | | | |
|---|---|---|---|---|---|
| Metric | SS | SF | TT | FS | FF |
| DC gain (dB) | 93.2 | 91.5 | 92 | 91.9 | 88.3 |
| Power (µW) @ 1 V | 262.1 | 307.8 | 243.5 | 292.9 | 328.2 |
| $f_t$ (MHz) | 63.9 | 69.4 | 73.5 | 78 | 85.4 |
| Phase Margin (°) | 63 | 67 | 66.7 | 66 | 67 |
| Avg. $T_s$ @ 1% (µs) | 0.046 | 0.024 | 0.077 | 0.032 | 0.033 |
| Avg. SR (V/µs) | 59.1 | 51.1 | 23.88 | 43.9 | 28.7 |
| Input-ref. noise ($nV/\sqrt{Hz}$) @ 10 kHz | 80.9 | 78.2 | 78.9 | 78 | 74.9 |

As can be seen in Table VI, all process corners, for all metrics, indicates no unforeseen sensitivity issues. It is clear from these simulations that the proposed OTA design is highly robust under PVT variations.

The above demonstrates that it is possible to extend the load driving capability of conventional Miller-RC CMOS OTAs by positioning the compensation network's P-ZP in a way that increases the OTA's $\omega_t$. The additional increase in $\omega_t$ can then be traded-off for higher loads by transferring the dependency of the dominant pole to $C_L$. As described herein, the technique of providing a compensation network coupled to a multi-stage amplifier using "low-frequency zeros" is applied. The compensation network is configured to position Pole-Zero pairs of each stage of the multi-stage amplifier below a unity gain frequency $\omega_t$ of the multi-stage amplifier when compensated, with Zeros positioned lower than Poles so as to increase the unity gain frequency $\omega_t$. The resulting amplifier circuit is shown to have enhanced gain, near optimum small- and large-signal time responses, and the ability to drive large capacitive loads.

The design techniques as described herein are applicable to any feedback system having a transfer function behaviour, such as but not limited to servo loop systems, quantum computing, neural networks, analog-to-digital converters, digital-to-analog converters, and the like.

Although the embodiments have been described in detail, it should be understood that various changes, substitutions and alterations can be made herein without departing from the scope as defined by the appended claims. Moreover, the scope of the present application is not intended to be limited to the particular embodiments described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

The invention claimed is:

1. An amplifier circuit comprising:

a multi-stage amplifier having a plurality of amplifiers cascaded between an input port Vin and an output port $V_{out}$ to form a differential input stage and N subsequent gain stages, with multiple Pole-Zero pairs arising from the N gain stages;

a capacitive load $C_L$ coupled to the output port $V_{out}$; and a compensation network coupled to the multi-stage amplifier and configured for positioning, using at least one compensation resistor in a kΩ range, the Pole-Zero pairs of each stage of the multi-stage amplifier at a frequency below a unity gain frequency $\omega_t$ of the multi-stage amplifier when compensated, with each Zero being positioned at a lower frequency than a corresponding Pole to increase the unity gain frequency $\omega_t$ and increase a phase margin of the multi-stage amplifier.

2. The amplifier circuit of claim 1, wherein the compensation network is further configured for positioning the Pole-Zero pairs of each stage of the multi-stage amplifier above a 3 dB frequency $\omega_{P0}$ of the multi-stage amplifier when compensated so as to increase a load-drive capability of the multi-stage amplifier.

3. The amplifier circuit of claim 2, wherein the capacitive load $C_L$ is in a range of pF to µF.

4. The amplifier circuit of claim 3, wherein the capacitive load $C_L$ is in a nF range.

5. The amplifier circuit of claim 1, wherein the multi-stage amplifier is a Miller RC differential-ended two-stage operational transconductance amplifier.

6. The amplifier circuit of claim 1, wherein N is an integer from 2 to 8.

7. The amplifier circuit of claim 1, wherein each of the N subsequent gain stages is a replicated common source gain stage.

8. The amplifier circuit of claim 1, wherein each of the N subsequent gain stages produces a same direct current (DC) gain as remaining ones of the N subsequent gain stages.

9. The amplifier circuit of claim 8, wherein each of the N subsequent gain stages has a DC gain between about 20 dB and about 25 dB.

10. The amplifier circuit of claim 1, wherein the compensation network comprises a plurality of compensation circuits, with a compensation circuit being provided for each stage of the multi-stage amplifier, and further wherein values of the compensation circuit for a 2-stage amplifier are scaled to size the compensation circuit of higher stages.

11. The amplifier circuit of claim 10, wherein the compensation circuit for each stage of the multi-stage amplifier is a multi-Miller RC compensation circuit, the plurality of compensation circuits configured to create paths between inputs and outputs of all stages of the multi-stage amplifier.

12. The amplifier circuit of claim 11, wherein the at least one compensation comprises a plurality of compensation resistors and the multi-stage amplifier further comprises a plurality of compensation capacitors, further wherein, when a new stage is added to the multi-stage amplifier, a size of the compensation resistors of preceding stages of the multi-stage amplifier is reduced to increase a frequency of Zeros of the new stage and a size of the compensation capacitors of the preceding stages is increased to decrease a frequency of Poles of the new stage.

13. The amplifier circuit of claim 12, wherein each stage higher than a second stage of the multi-stage amplifier comprises a compensation capacitor sized to a minimum capacitance value identified for the 2-stage amplifier.

14. The amplifier circuit of claim 1, wherein the multi-stage amplifier comprises at least one common-mode feedback circuit configured to apply biasing voltages to outputs of the stages of the multi-stage amplifier.

15. The amplifier circuit of claim 14, wherein, for N≤3, the at least one common-mode feedback circuit comprises a first common-mode feedback circuit.

16. The amplifier circuit of claim 15, wherein, for N=2, the first common-mode feedback circuit is connected to an output of a second stage of the multi-stage amplifier.

17. The amplifier circuit of claim 15, wherein, for N=3, the first common-mode feedback circuit is connected to an output of a third stage of the multi-stage amplifier.

18. The amplifier circuit of claim 15, wherein, for N≥4, the at least one common-mode feedback circuit further comprises a second common-mode feedback circuit, the first common-mode feedback circuit connected to an output of a third stage of the multi-stage amplifier and the second common-mode feedback circuit connected to an output of each additional stage following the third stage.

* * * * *